US011404351B2

(12) United States Patent
Zhou

(10) Patent No.: US 11,404,351 B2
(45) Date of Patent: Aug. 2, 2022

(54) CHIP-ON-CHIP POWER CARD WITH EMBEDDED DIRECT LIQUID COOLING

(71) Applicant: Toyota Motor Engineering & Manufacturing North America, Inc., Plano, TX (US)

(72) Inventor: Feng Zhou, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 297 days.

(21) Appl. No.: 16/854,797

(22) Filed: Apr. 21, 2020

(65) Prior Publication Data

US 2021/0327788 A1  Oct. 21, 2021

(51) Int. Cl.
| | |
|---|---|
| H01L 23/495 | (2006.01) |
| H01L 23/34 | (2006.01) |
| H01L 21/00 | (2006.01) |
| H05K 7/18 | (2006.01) |
| H01L 23/473 | (2006.01) |
| H01L 21/48 | (2006.01) |
| H01L 25/00 | (2006.01) |
| H01L 25/07 | (2006.01) |
| H05K 7/20 | (2006.01) |
| H01L 23/00 | (2006.01) |
| H01L 33/62 | (2010.01) |

(52) U.S. Cl.
CPC ........ *H01L 23/473* (2013.01); *H01L 21/4821* (2013.01); *H01L 23/49537* (2013.01); *H01L 23/49541* (2013.01); *H01L 23/49575* (2013.01); *H01L 25/072* (2013.01); *H01L 25/50* (2013.01); *H05K 7/20872* (2013.01); *H01L 24/32* (2013.01); *H01L 24/33* (2013.01); *H01L 33/62* (2013.01); *H01L 2224/32245* (2013.01); *H01L 2224/33181* (2013.01)

(58) Field of Classification Search
CPC ... H01L 21/4821; H01L 33/62; H01L 25/072; H01L 25/50; H01L 23/473; H01L 23/49537; H01L 23/49541; H01L 23/49575; H01L 23/49513; H01L 23/49568
See application file for complete search history.

(56) References Cited

U.S. PATENT DOCUMENTS

| | | |
|---|---|---|
| 5,032,691 A | 7/1991 | Kaufman |
| 5,049,973 A | 9/1991 | Satriano et al. |
| 5,426,563 A | 6/1995 | Moresco et al. |
| (Continued) | | |

FOREIGN PATENT DOCUMENTS

WO    WO-2019031348 A1 *  2/2019  ......... H01L 21/4871

*Primary Examiner* — Alonzo Chambliss
(74) *Attorney, Agent, or Firm* — Snell & Wilmer LLP

(57) ABSTRACT

Methods, systems, and apparatuses for a power card for use in a vehicle. The power card includes an N lead frame, a P lead frame, and an O lead frame each having a body portion and a terminal portion, with the O lead frame located between the N lead frame and the P lead frame. The power card includes a first power device being located on a first side of the O lead frame and a second power device being located on a second side of the O lead frame, the body portion of the O lead frame having one or more channels configured to receive a cooling liquid for cooling the first power device and the second power device.

20 Claims, 28 Drawing Sheets

(56) References Cited

U.S. PATENT DOCUMENTS

| | | | |
|---|---|---|---|
| 6,437,981 B1 | 8/2002 | Newton et al. | |
| 6,956,284 B2 | 10/2005 | Cady et al. | |
| 7,204,298 B2 | 4/2007 | Hodes et al. | |
| 7,485,957 B2 | 2/2009 | Brandenburg et al. | |
| 7,551,439 B2 | 6/2009 | Peugh et al. | |
| 8,969,132 B2 | 3/2015 | Sherrer et al. | |
| 9,337,152 B2 | 5/2016 | Sherrer et al. | |
| 9,875,953 B2 | 1/2018 | Chainer et al. | |
| 10,037,972 B2 | 7/2018 | Fuergut et al. | |
| 10,486,232 B2 | 11/2019 | Abeshaus et al. | |
| 2007/0023889 A1 | 2/2007 | Salmon | |
| 2009/0194862 A1 | 8/2009 | Kitami | |
| 2012/0001341 A1* | 1/2012 | Ide | H01L 25/117 257/773 |
| 2021/0327791 A1* | 10/2021 | Zhou | H01L 23/4334 |

* cited by examiner

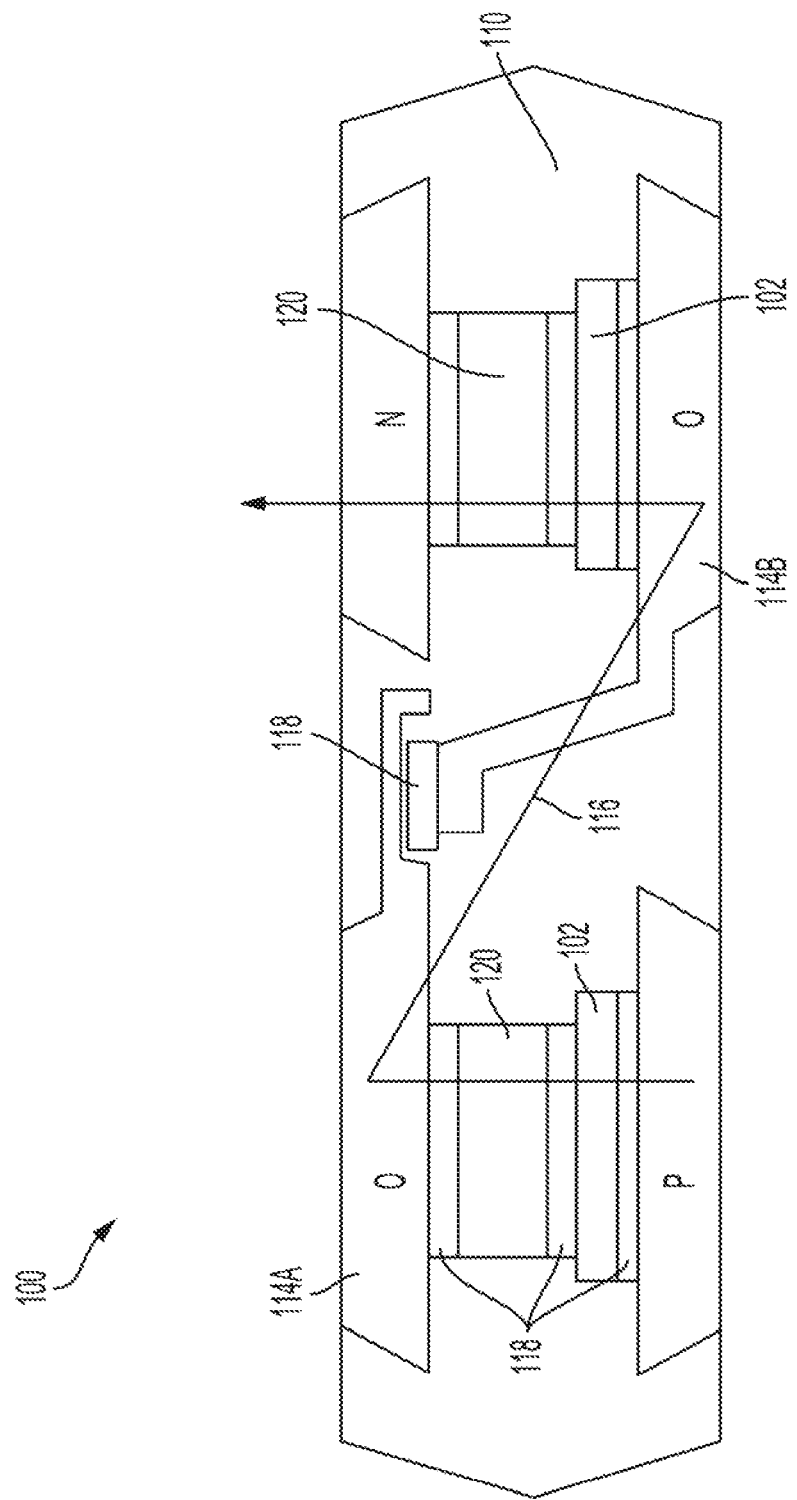

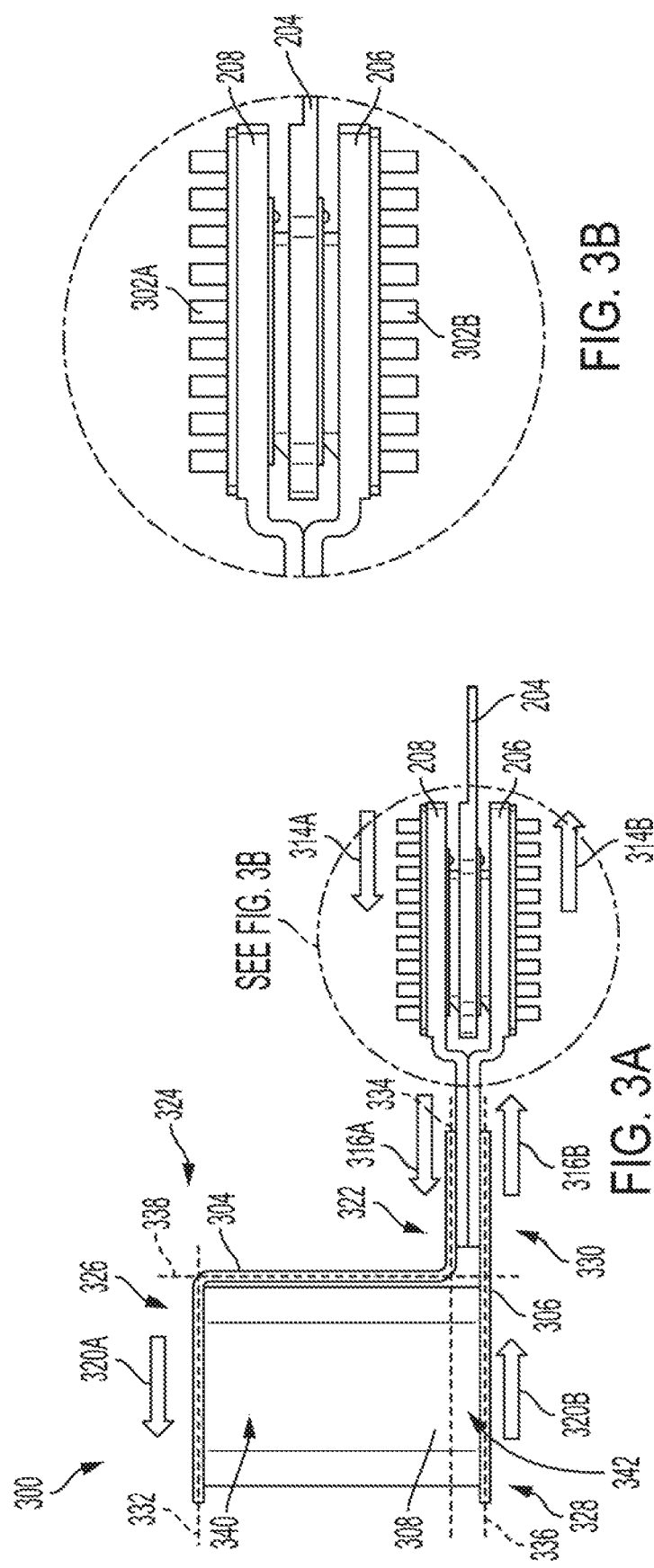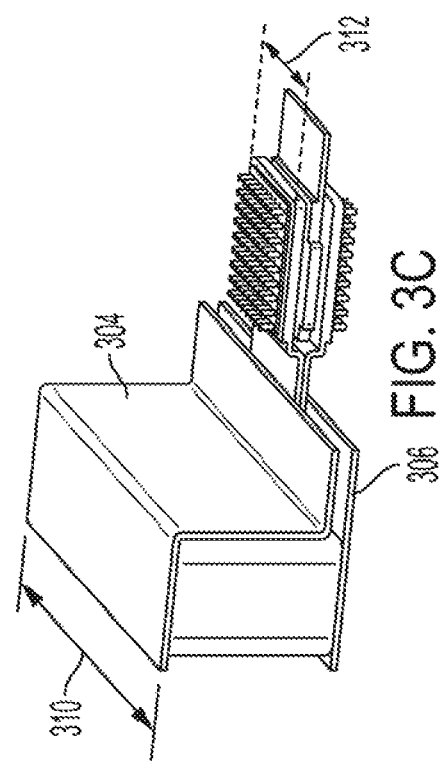

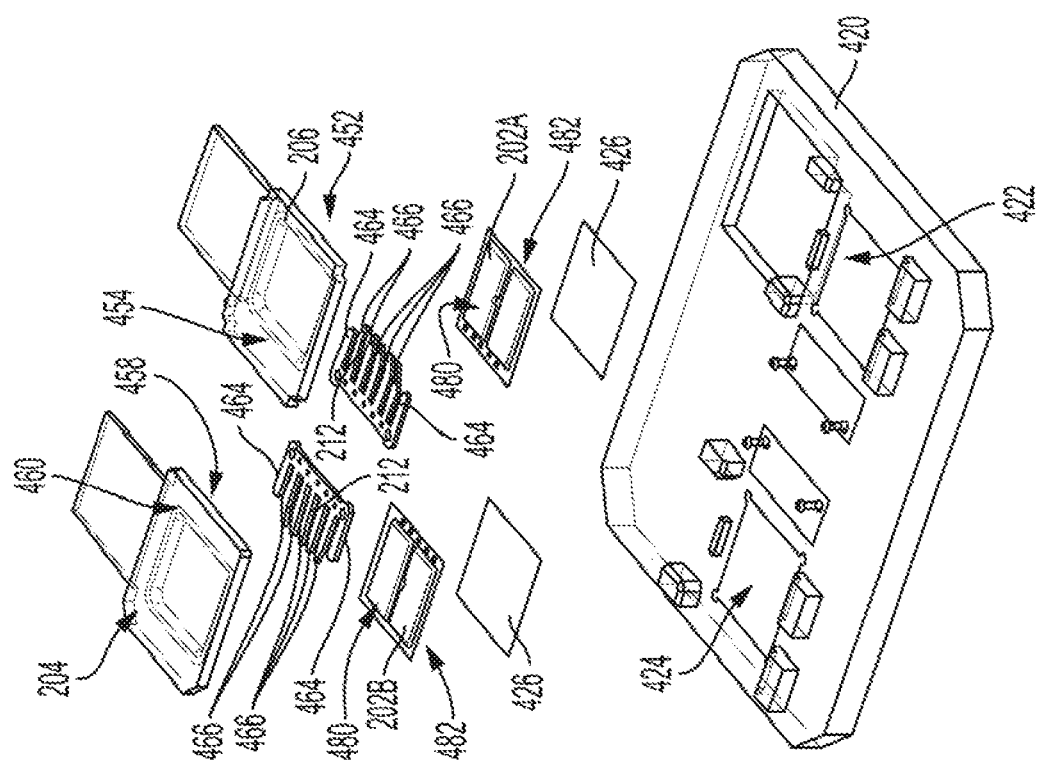

CHIP-ON-CHIP POWER CARD WITH EMBEDDED DIRECT LIQUID COOLING

BACKGROUND

1. Field

This specification relates to a compact low inductance chip-on-chip power card and method of manufacturing the same.

2. Description of the Related Art

Modern vehicles use electricity as part of the operation of the vehicle. These vehicles may be operated using electricity exclusively, or by using a combination of electricity and another energy source. Many modern vehicles include a power control unit (PCU) configured to manage the energy amongst multiple different vehicle electrical systems. In the case of vehicles driven by electric motors, a power control unit may be used to control the electric motor, including torque and speed of the motor. A component of the power control unit is a power card, which contains power devices that may be switched on and off in high frequency during operation of the vehicle. These power devices may generate significant amounts of heat. Conventional power cards have designs for exposing surface area of the power devices for cooling purposes. However, these conventional power cards are bulky and not useful in compact space contexts. Thus, there is a need for a power card capable of providing cooling and being compact.

SUMMARY

What is described is a power card for use in a vehicle. The power card includes an N lead frame having a body portion and a terminal portion, the terminal portion extending outward from the body portion. The power card also includes a P lead frame having a body portion and a terminal portion, the terminal portion extending outward from the body portion. The power card also includes an O lead frame having a body portion and a terminal portion, the terminal portion extending outward from the body portion, the O lead frame being located between the N lead frame and the P lead frame. The power card also includes a first power device being located on a first side of the O lead frame between the body portion of the N lead frame and the body portion of the O lead frame. The power card also includes a second power device being located on a second side of the O lead frame between the body portion of the O lead frame and the body portion of the P lead frame, the body portion of the O lead frame having one or more channels configured to receive a cooling liquid for cooling the first power device and the second power device.

Also described is a power system having a power card and a liquid cooler. The power card includes an O lead frame located between an N lead frame and a P lead frame. The power card also includes a first power device located on a first side of the O lead frame between the N lead frame and the O lead frame. The power card also includes a second power device located on a second side of the O lead frame between the O lead frame and the P lead frame, the O lead frame having one or more channels configured to receive a cooling liquid for cooling the first power device and the second power device. The liquid cooler is coupled to the one or more channels of the O lead frame and configured to provide the cooling liquid to the one or more channels of the O lead frame.

Also described is a lead frame for use in a vehicle power card. The lead frame includes a body portion having a first side coupled to a first power device, a second side coupled to a second power device, and one or more channels configured to receive a cooling liquid for cooling the first power device and the second power device. The lead frame also includes a terminal portion extending outward from the body portion.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

FIGS. 1A-1C illustrate a power card, according to various embodiments of the invention.

FIGS. 3A-3C illustrate the compact low inductance chip-on-chip power card connected with a capacitor, according to various embodiments of the invention.

FIGS. 4A-4D illustrate a method of manufacturing the compact low inductance chip-on-chip power card, according to various embodiments of the invention.

DETAILED DESCRIPTION

Disclosed herein are power cards and methods of manufacture thereof. A power card may be a part of a power control unit of a vehicle. The power control unit is configured to manage the energy amongst multiple different vehicle electrical systems. In vehicles with electric motors, the power control unit may be responsible for operation of the electric motor. The power control unit may include a power card having power devices that are switched on and off at high frequencies during operations of the vehicle. These power devices may be any switch, such as an RC-IGBT, an IGBT/diode combination, or a MOSFET, for example.

Conventional silicon-based power cards have an inductance higher than 20 nH. If silicon carbide is applied, instead of silicon, to the same power card structure, being switched at a higher frequency, high switching losses will be generated due to the relatively high inductance.

The power card described herein have a lower inductance and a more compact design. There are many contexts in a vehicle where a more compact power card may provide many benefits. For example, when a vehicle has multiple electric motors driving wheels independently (instead of a central electric motor providing power to the wheels), a compact power card at each wheel may be highly beneficial. A compact power card may provide for more efficient and lighter weight systems, as the power card and the motor could share components, such as cooling devices.

The power card described herein may include O lead frames designed to efficiently cool the power devices of the power card. The O lead frame may include cooling channels for passing a liquid to absorb heat. The O lead frame may include a vapor chamber for cooling heat received from the power devices. The O lead frame may also be made of materials having specific thermal conductivity characteristics for improved heat absorption and dissipation.

The power cards described herein may be used with a vehicle. A vehicle is a conveyance capable of transporting a person, an object, or a permanently or temporarily affixed apparatus. The vehicle may have an automatic or manual transmission. The vehicle may be a self-propelled wheeled conveyance, such as a car, sports utility vehicle, truck, bus, van or other motor or battery driven vehicle. For example, the vehicle may be an electric vehicle, a hybrid vehicle, a plug-in hybrid vehicle, a fuel cell vehicle, or any other type of vehicle that includes a motor/generator.

The vehicle may be capable of non-autonomous operation or semi-autonomous operation or autonomous operation. That is, the vehicle may be driven by a human driver or may be capable of self-maneuvering and navigating without human input. A vehicle operating semi-autonomously or autonomously may use one or more sensors and/or a navigation unit to drive autonomously.

Figure 1A:
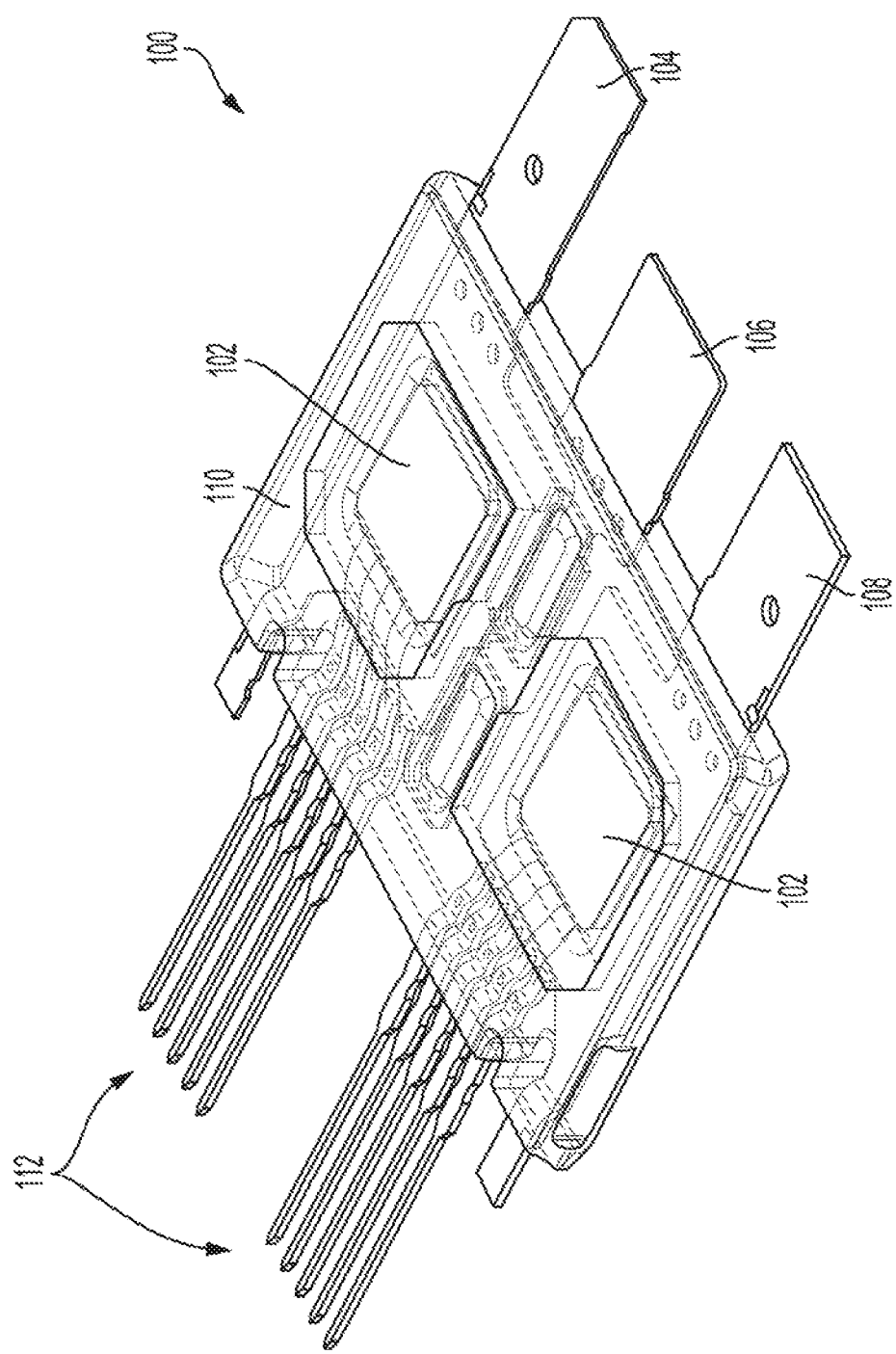

FIG. 1A illustrates a perspective view of a power card 100 having a side-by-side design. The power card 100 includes two power devices 102 located in a co-planar, side-by-side arrangement. The power card 100 also includes an O power terminal 104, an N power terminal 106, a P power terminal 108, and signal terminals 112. The power card 100 is encased in resin 110, with the power terminals and signal terminals exposed.

Figure 1B:
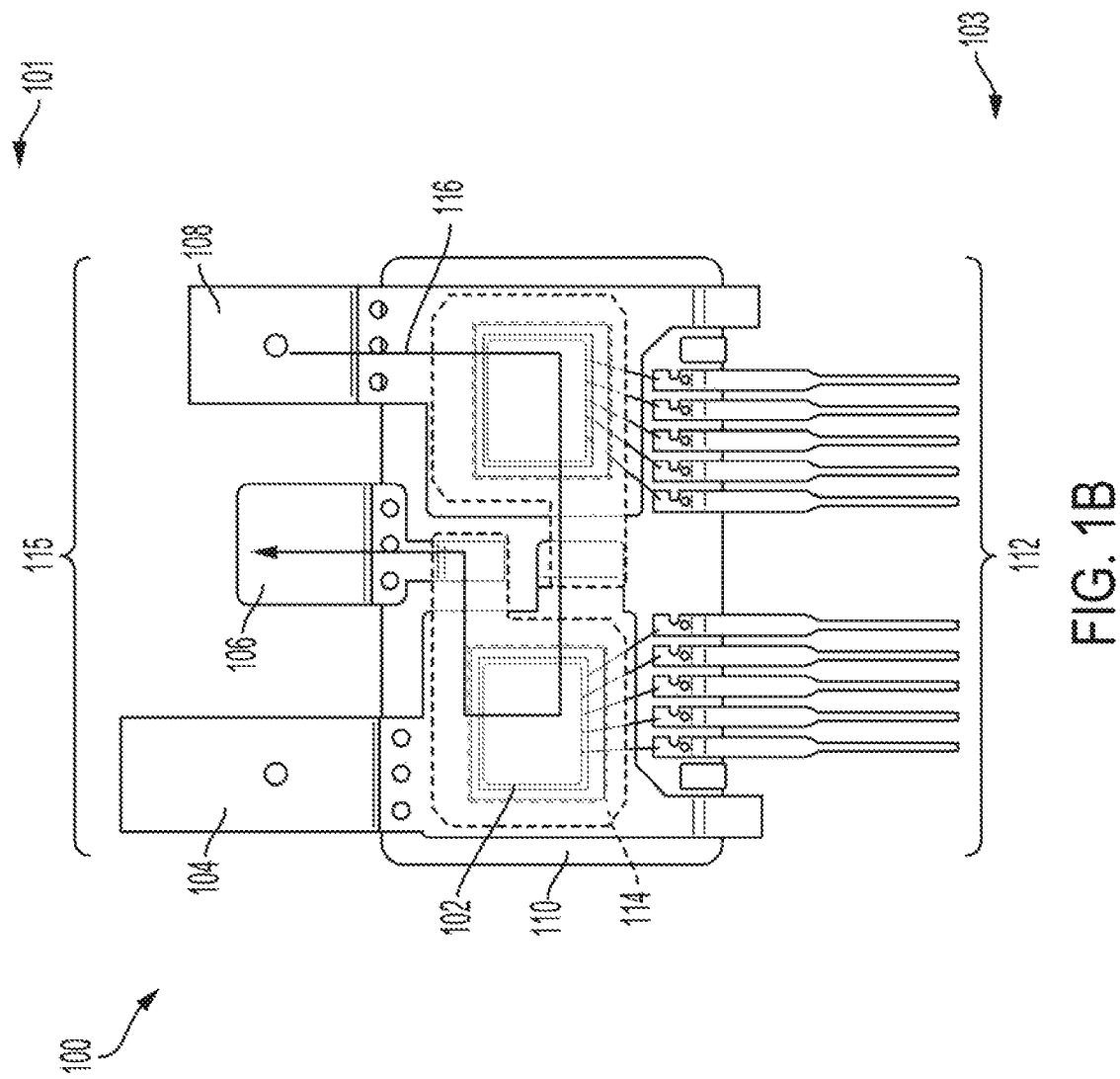

FIG. 1B illustrates a top-down view of the power card 100 having the side-by-side design. As can be seen in FIG. 1B, the power terminals 115 (i.e., the O power terminal 104, the N power terminal 106, and the P power terminal 108) and the signal terminals 112 are not entirely encased in resin 110. In addition, the power terminals 115 are located on a first end 101 of the power card 100, and the signal terminals 112 are located on a second end 103 of the power card 100. The power card 100 also includes heat spreaders 114 configured to absorb heat generated by the power devices 102. Electrical current 116 flows from the P power terminal 108 to the power devices 102, and through the N power terminal 106. The O power terminal serves as an output. For example, when the power card is used in conjunction with multiple other power cards in an inverter, the P terminal and N terminal of each power card may be connected to the DC power source, and the O power terminal of each power card is responsible for outputting one phase of the alternating current, with the combined outputs of the O power terminals creating an alternating current. The alternating current may be used to power a motor, for example. When the inverter is bi-directional, alternating current generated by regenerative braking, for example, could be received by the O power terminals of the multiple power cards, and a DC battery may be recharged using the power cards.

FIG. 1C is a partial side cross-sectional view of the power card 100. As shown, the power devices 102 are co-planar with each other. One power device 102 is connected to the P power terminal 108 on a first side using solder 118, and is connected to a conductive copper spacing block 120 on a second side using solder 118. The conductive copper spacing block 120 is connected to a first heat spreader 114A using solder 118. The first heat spreader 114A has an arm that extends laterally sideways toward the N power terminal 106 and is connected (using solder 118) to a laterally-extending arm of a second heat spreader 114B. The second heat spreader 114B is connected to the other power device 102 using solder 118. The other power device 102 is connected to the second heat spreader 114B on a first side using solder 118, and is connected to a conductive copper spacing block 120 on a second side using solder 118. The conductive copper spacing block 120 is connected to the N power terminal 106 using solder 118. Electrical current 116 moves upward from the P power terminal 108, through a power device 102, down through the heat spreaders 114, through the other power device 102, and through the N power terminal 106.

Figure 2A:
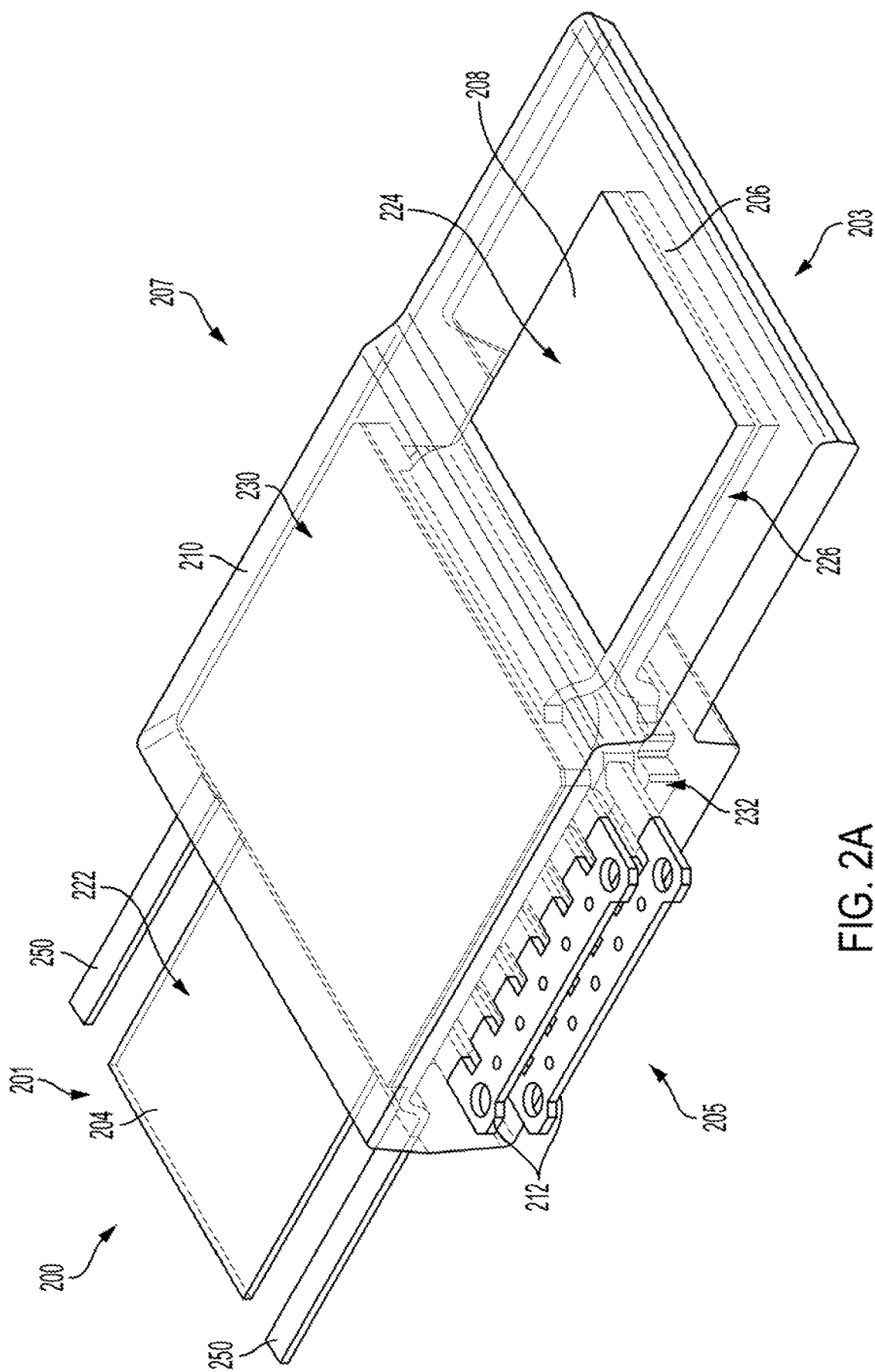
FIGS. 2A-2F illustrate a compact low inductance chip-on-chip power card, according to various embodiments of the invention.

FIG. 2A illustrates a power card 200. The power card 200 has a chip-on-chip design, where the power devices are located in a vertically stacked arrangement, as compared to the side-by-side design of power card 100. The chip-on-chip design allows the volume of the power card 200 to be reduced by 49% compared to the power card 100 with the side-by-side design.

Figure 2B:
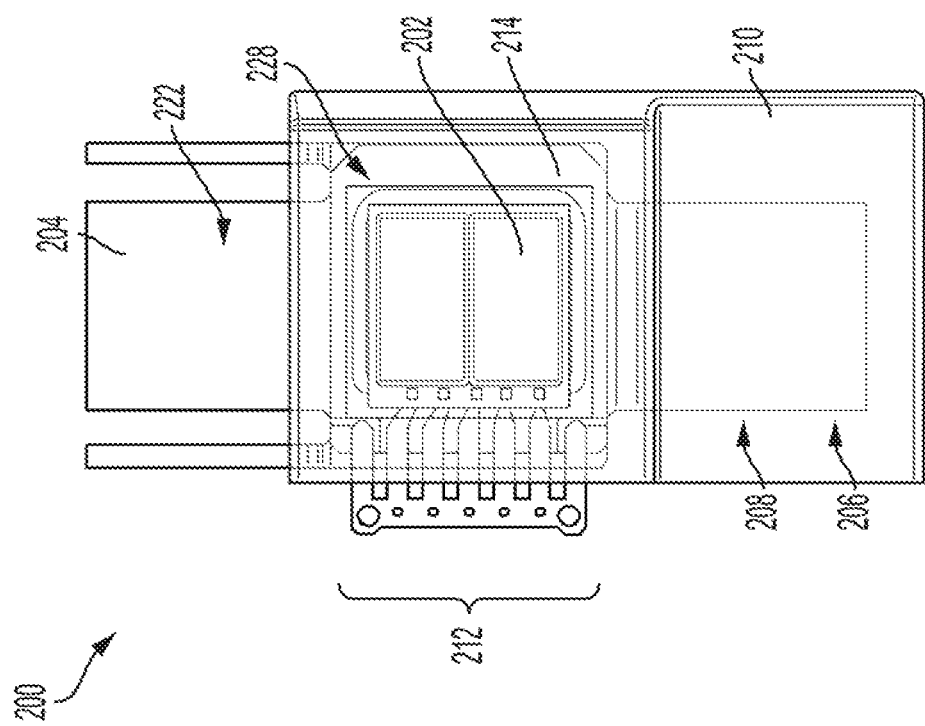
Figure 2D:
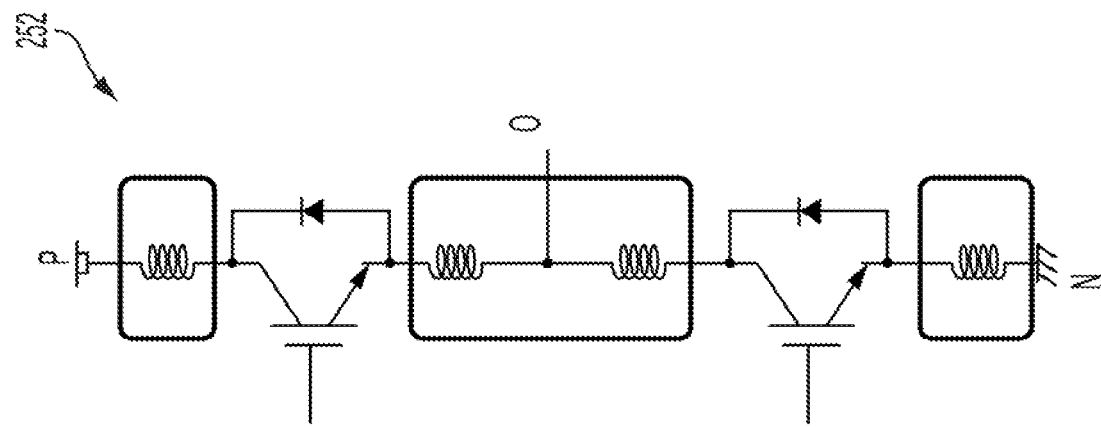
Figure 2C:
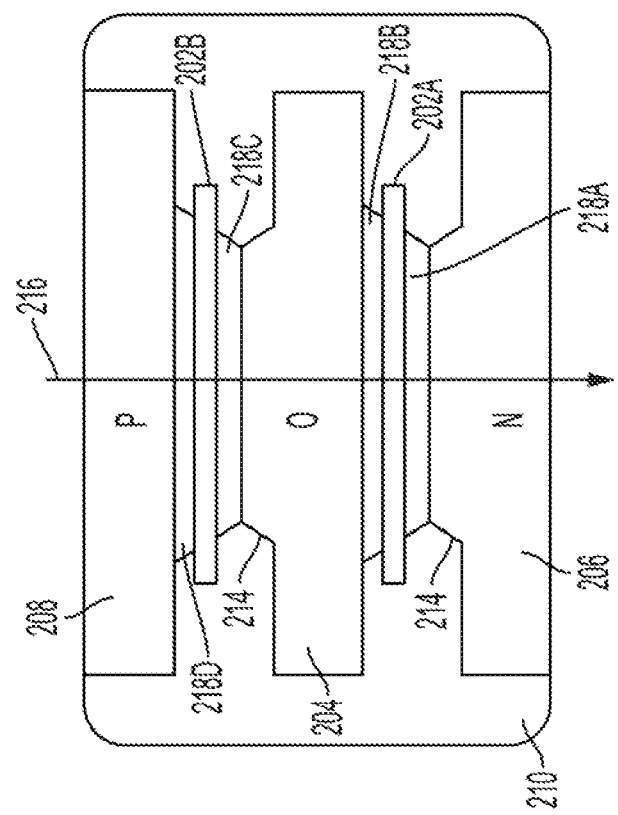
Figure 2E:
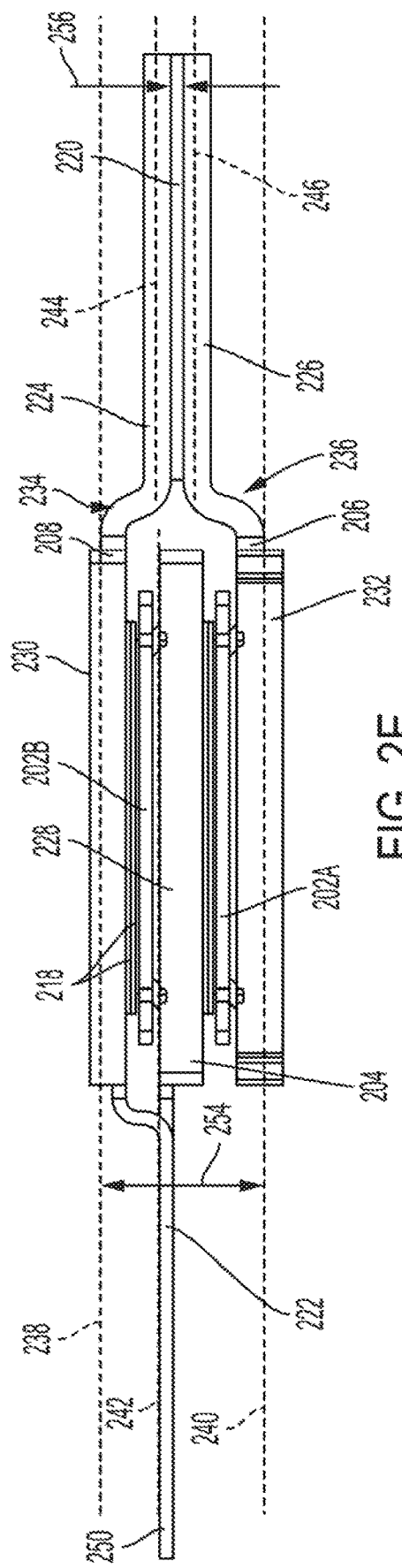

The power card 200 includes an O lead frame 204 having a terminal portion 222 extending from a body portion 228 (shown in FIGS. 2B and 2E). The power card 200 also includes an N lead frame 206 having a terminal portion 226 extending from a body portion 232. The power card 200 also includes a P lead frame 208 having a terminal portion 224 extending from a body portion 230. The terminal portions are configured to connect to other vehicle components to connect the power card 200 to the vehicle. In some embodiments, the body portions of the lead frames may be referred to as the substrate. Electrical current flows from the terminal portion 224 of the P lead frame 208 to the terminal portion 226 of the N lead frame 206. The terminal portion 222 of the O lead frame 204 serves as an output. For example, when the power card 200 is used in conjunction with multiple other power cards (similar to power card 200) in an inverter, the terminal portion 224 of the P lead frame 208 and the terminal portion 226 of the N lead frame 206 of each power card may be connected to the DC power source, and the terminal portion 222 of the O lead frame 204 of each power card is responsible for outputting one phase of the alternating current, with the combined outputs of the terminal portions of the O lead frames of each power card creating an alternating current. The alternating current may be used to power a motor, for example. When the inverter is bi-directional, alternating current generated by regenerative braking, for example, could be received by the terminal portions of the O lead frames of the multiple power cards, and a DC battery may be recharged using the power cards.

The power card 200 has a first end 201 and a second end 203 opposite the first end 201. The terminal portion 222 of the O lead frame is located at the first end 201 and the terminal portion 226 of the N lead frame and the terminal portion 224 of the P lead frame 208 are located at the second end 203. By being on opposite ends of the power card 200, the terminal portions of the O lead frame 204, the N lead frame 206, and the P lead frame 208 may be as wide as the power device. In comparison, the power terminals 115 of the side-by-side power card 100 are narrower (approximately half the width of the power device 102) because the power terminals 115 are all on the same end of the power card 100. In addition, by having the terminal portion 222 of the O lead frame 204 on the opposite end as the terminal portion 224 of the P lead frame 208 and the terminal portion 226 of the N lead frame 206, the terminal portion 224 of the P lead frame 208 and the terminal portion 226 of the N lead frame 206 may be located very close to each other and separated by a thin insulator. This close location to each other results in very low inductance for high-speed switching of the power devices.

The power card 200 includes two sets of signal terminals 212, one set for each of the two power devices. Each set of signal terminals is connected to a respective power device. The set of signal terminals 212 provides connections to the power device, for purposes of providing switching signals to the power device and also for purposes of detecting data from the power device. For example, when there are 5 signal terminals in the set of signal terminals 212, one signal terminal may connected to the gate of the power device and be used as a gate signal for switching the power device on and off using low voltage, two signal terminals may be used for detecting temperature, one signal terminal may be used as a current sensor, and one signal terminal may be used as an emitter voltage sensor.

The power card 200 also includes voltage terminals 250 as being part of the P lead frame 208. The voltage terminals 250 may be used to detect a voltage of the power card 200. The voltage terminals 250 extend away from the body portion 230 of the P lead frame 208, but in a direction opposite the terminal portion 224 of the P lead frame 208. Thus, the voltage terminals 250 are located at the first end 201 of the power card 200, alongside the terminal portion 222 of the O lead frame 204. The voltage terminals 250 may be located horizontally on either side of the terminal portion 222 of the O lead frame 204.

The power card 200 has a first lengthwise edge 205 and a second lengthwise edge 207 opposite the first lengthwise edge 205. As shown in FIG. 2A, the sets of signal terminals 212 are located at the first lengthwise edge 205 and the voltage terminals 250 are located at the first end 201. However, in some embodiments, the voltage terminals 250 may be removed and the sets of signal terminals 212 may be reduced to a single signal terminal corresponding to each power device, and these single signal terminals may be located horizontally on either side of the terminal portion 222 of the O lead frame 204, similar to the location of the voltage terminals 250 in FIG. 2A.

The power card 200 may be partially encased in resin 210. The resin 210 may be injection molded to the power card 200 such that all gaps between the components of the power card 200 are occupied with resin 210. The resin 210 may insulate the components of the power card 200 to allow the power card 200 to operate more efficiently. The terminal portion 222 of the O lead frame 204, the voltage terminals 250, portions of the sets of signal terminals 212, a portion of the terminal portion 224 of the P lead frame, and a portion of the terminal portion 226 of the N lead frame may not be covered in resin 210, with the remaining components of the power card 200 being encased in resin 210. The exposed portion of the terminal portion 224 of the P lead frame may be the top surface of the terminal portion 224. The exposed portion of the terminal portion 226 of the N lead frame may be the bottom surface of the terminal portion 226.

FIG. 2B illustrates a top-down view of the power card 200, with the body portion of the P lead frame 208 made transparent, to show one of the two power devices 202 and a set of signal terminals 212 connected to the power device 202. The power device 202 may be any switch, such as an RC-IGBT, an IGBT/diode combination, or a MOSFET, for example.

The body portion 228 of the O lead frame 204 is substantially square-shaped and is located in a central portion of the power card 200, between the first end 201 and the second end 203. Similarly, the body portion 230 of the P lead frame 208 is substantially square-shaped and is located in a central portion of the power card 200, between the first end 201 and the second end 203. In addition, the body portion 232 of the N lead frame 206 is substantially square-shaped and is located in a central portion of the power card 200, between the first end 201 and the second end 203.

Between the body portion 228 of the O lead frame 204 and the power device 202 may be a heat spreader 214. The heat spreader 214 may be formed integrally of the O lead frame 204 at the body portion 228 and may elevate the power device 202 away from the O lead frame 204. The N lead frame 206 may have a similar heat spreader, as shown in FIG. 2C.

FIG. 2C illustrates a partial front cross-sectional view of the power card 200 in a central area of the power card 200 where the body portions of the lead frames and the power devices am located. The N lead frame 206 and the O lead frame 204 have heat spreaders 214 formed integrally in the respective body portions of the N lead frame 206 and the O lead frame 204. That is, the body portion 232 of the N lead frame 206 has a heat spreader 214 formed integrally in the body portion 232. The heat spreader 214 extends upward and away from the body portion 232 of the N lead frame 206. The heat spreader 214 extends in a direction perpendicular to the direction that the terminal portion 226 extends in. The heat spreader 214 may have a tapered shape such that the width of the heat spreader 214 narrows the further away the heat spreader 214 is from the body portion 232 of the N lead frame 206.

The body portion 232 of the N lead frame 206 connects to a first power device 202A (via the heat spreader 214). The body portion 232 of the N lead frame 206 is connected to the first power device 202A via solder 218A. The solder 218A may be applied as a layer between the body portion 232 of the N lead frame 206 and the first power device 202A or may be applied in discrete areas between the body portion 232 of the N lead frame 206 and the first power device 202A.

Similarly, the body portion 228 of the O lead frame 204 has a heat spreader 214 formed integrally in the body portion 228. The heat spreader 214 extends upward and away from the body portion 228 of the O lead frame 204. The heat spreader 214 extends in a direction perpendicular to the direction that the terminal portion 222 extends in. The heat spreader 214 may have a tapered shape such that the width of the heat spreader 214 narrows the further away the heat spreader 214 is from the body portion 228 of the O lead frame 204.

The heat spreader 214 may be located on a first side of the body portion 228 of the O lead frame 204. The first power device 202A may be connected to the second side of the body portion 228 of the O lead frame 204 using solder 218B. The solder 218B may be applied as a layer or in discrete areas. The second side of the body portion 228 of the O lead frame 204 is opposite the first side of the body portion 228 of the O lead frame 204.

The body portion 228 of the O lead frame 204 connects to a second power device 202B (via the heat spreader 214). The body portion 228 of the O lead frame 204 is connected to the second power device 202B via solder 218C. The solder 218C may be applied as a layer between the body portion 228 of the O lead frame 204 and the second power device 202B or may be applied in discrete areas between the body portion 228 of the O lead frame 204 and the second power device 202B.

The second power device 202B is connected to the body portion 230 of the P lead frame 208 using solder 218D. Unlike the N lead frame 206 and the O lead frame 204, the P lead frame 208 may not have a heat spreader 214. Again, the heat spreaders 214 serve to provide space for the signal terminals to connect to the signal pads of the power devices 202. Without the heat spreaders 214, there may not be sufficient space for signal terminals to reach the power devices 202.

As shown in FIG. 2C, electrical current 216 travels from the P lead frame 208 through the two power devices 202 and through the N lead frame 206. As compared to electrical current 116 of FIG. 1C of the side-by-side power card 100, the electrical current 216 travels in a shorter, straighter line. This makes the operation of the power card 200 more efficient than the power card 100 by reducing self-inductance.

In addition, as compared to the side-by-side power card 100 shown in FIG. 1C, the power card 200 has fewer components, as the side-by-side power card 100 includes more components that the power card 200 does not include—two conductive copper spacing blocks 120, two layers of solder 118 connecting each conductive copper spacing block 120 to another component, and a layer of solder between the heat spreaders 114. In addition, the heat spreaders 114 of the side-by-side power card 100 are bulkier than the integrated heat spreaders 214 of the power card 200.

FIG. 2D illustrates a circuit diagram 252 representing the power card 200.

FIG. 2E illustrates a side view of components of the power card 200. The body portion 230 of the P lead frame 208 is aligned with the body portion 228 of the O lead frame 204 as well as the body portion 232 of the N lead frame 206. In addition, the first power device 202A is shown as being between the body portion 232 of the N lead frame 206 and the body portion 228 of the O lead frame 204. The second power device 202B is shown as being between the body portion 228 of the O lead frame 204 and the body portion 230 of the P lead frame 208.

The terminal portion 224 of the P lead frame 208 is connected to the body portion 230 of the P lead frame 208 by a bend 234. The body portion 230 of the P lead frame lies along a P body plane 238 and the terminal portion 224 of the P lead frame 208 lies along a P terminal plane 244. The P body plane 238 and the P terminal plane 244 are parallel. The bend 234 brings the terminal portion 224 of the P lead frame 208 closer to the N lead frame 206.

The terminal portion 226 of the N lead frame 206 is connected to the body portion 232 of the N lead frame 206 by a bend 236. The body portion 232 of the N lead frame lies along an N body plane 240 and the terminal portion 226 of the N lead frame 206 lies along an N terminal plane 246. The N body plane 240 and the N terminal plane 246 are parallel. The bend 236 brings the terminal portion 226 of the N lead frame 206 closer to the P lead frame 208.

The distance 254 between the body portion 230 of the P lead frame 208 and the body portion 232 of the N lead frame 206 is greater than the distance 256 between the terminal portion 224 of the P lead frame 208 and the terminal portion 226 of the N lead frame 206 due to the bends 234, 236.

An insulator 220 may be located between the terminal portion 224 of the P lead frame 208 and the terminal portion 226 of the N lead frame 206. The voltage difference between the terminal portion 224 of the P lead frame 208 and the terminal portion 226 of the N lead frame 206 is relatively high. The insulator 220 may be configured to assist in reducing inductance between the P terminal and the N terminal. The insulator 220 may span the entire length of the terminal portion 224 of the P lead frame 208 and the terminal portion 226 of the N lead frame 206, or may occupy a portion thereof. The insulator 220 may be made of ceramic or any other insulating material. The insulator 220 may be very thin—approximately 320 μm thick. The insulator 220 may occupy the entire distance 256 between the terminal portion 224 of the P lead frame 208 and the terminal portion 226 of the N lead frame 206.

The body portion 228 of the O lead frame 204 has a top surface that lies along an O plane 242. The terminal portion 222 of the O lead frame 204 may also lie along the O plane 242 such that a top surface of the body portion 228 of the O lead frame is coplanar to a top surface of the terminal portion 222 of the O lead frame 204.

The voltage terminals 250 of the P lead frame 208 may extend in a direction opposite the terminal portion 224 of the P lead frame 208. The voltage terminals 250 may be connected to the body portion 230 of the P lead frame 208 by a bend, and the voltage terminals 250 may lie along the O plane 242.

Figure 2F:
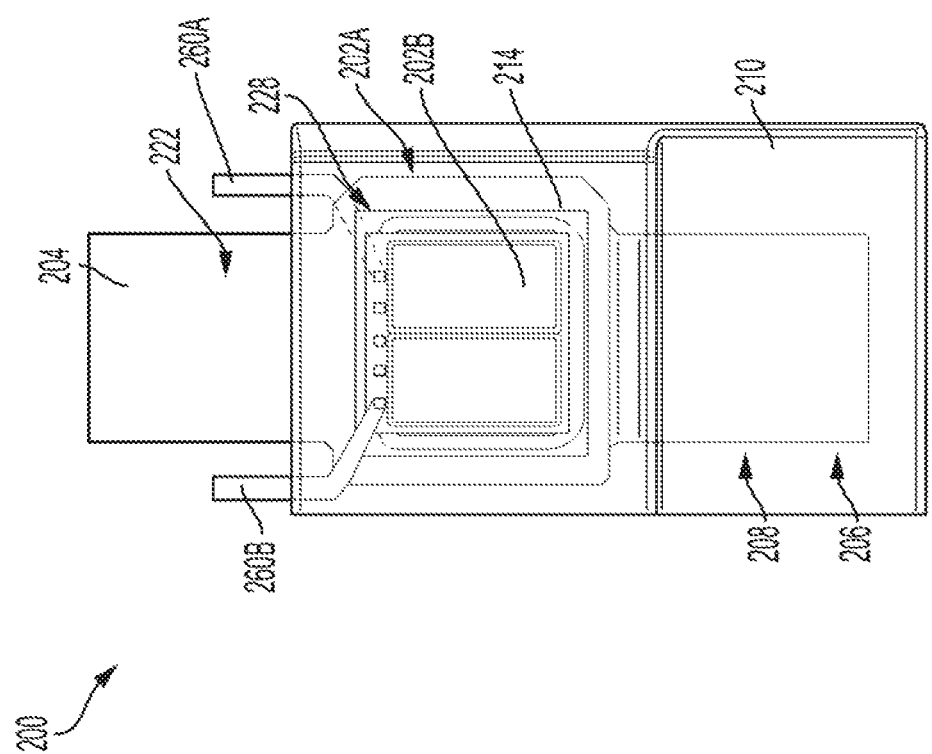

FIG. 2F illustrates an embodiment of the power card 200 without voltage terminals 250 of the P lead frame 208. The view of FIG. 2F is a top-down view of the power card 200, with the body portion of the P lead frame 208 made transparent, to show the second power device 202B, similar to FIG. 2B. The first power device 202A is obscured by the O lead frame 204.

In embodiments where the voltage terminals 250 are not present, the sets of signal terminals 212 may be replaced by a single signal terminal 260A for the first power device 202A and a single signal terminal 260B for the second power device 202B. Both of the single signal terminals 260 may lie along the O plane 242, similar to the previously-present voltage terminals 250.

The signal terminals 260 may receive signals for switching on and off their respective devices. That is, the first signal terminal 260A may receive signals for switching on and off the first power device 202A and the second signal terminal 260B may receive signals for switching on and off the second power device 202B.

The power devices 202 may be rotated to allow the contacts of the power devices 202 to be close to the signal terminals 260 and allowing the signal terminals 260 to be as short as possible. While FIG. 2F illustrates the signal terminals 260 as being on either side of the terminal portion 222 of the O lead frame 204, the signal terminals 260 may be located at any other location on the power card (e.g., along the lengthwise edges). Also, while FIG. 2F illustrates the signal terminals 260 as extending outward with a length that is a fraction of the length of the terminal portion 222 of the O lead frame 204, the signal terminals 260 may be of any length.

FIG. 3A illustrates a system 300 using the power card 200. The terminal portion 224 of the P lead frame 208 and the terminal portion 226 of the N lead frame 206 are connected to a capacitor 308 via a P bus bar 304 and an N bus bar 306, respectively. That is, the P bus bar 304 is connects a second end 340 of the capacitor 308 to the terminal portion 224 of the P lead frame 208. In particular, a bottom surface of the P bus bar 304 contacts a top surface of the terminal portion 224 of the P lead frame 208. In addition, the N bus bar 306 connects a first end 342 of the capacitor 308 to the terminal portion 226 of the N lead frame 206. In particular, a top surface of the N bus bar 306 contacts a bottom surface of the terminal portion 226 of the N lead frame 206.

The N bus bar 306 has a first portion 330 and a second portion 328. The first portion 330 connects to the terminal portion 226 of the N lead frame 206. In particular, a top surface of the first portion 330 of the N bus bar 306 contacts a bottom surface of the terminal portion 226 of the N lead frame 206. The second portion 328 contacts the first end 342 of the capacitor 308. The first portion 330 and the second portion 328 both lie along a first plane 336. The first plane 336 is parallel to the N terminal plane 246.

The P bus bar 304 has a first portion 322, a second portion 324, and a third portion 326. The first portion 322 connects to the terminal portion 224 of the P lead frame 208. In particular, the bottom surface of the first portion 322 connects to the top surface of the terminal portion 224 of the P lead frame 208. The first portion 322 lies along a second plane 334 that is parallel to the P terminal plane 244. The second plane 334 is also parallel to the first plane 336.

The second portion 324 of the P bus bar 304 travels up a side of the capacitor 308. The second portion 324 lies along a third plane 338 perpendicular to the first plane 336 and the second plane 334.

The third portion 326 of the P bus bar 304 connects to a second end 340 of the capacitor 308. The third portion 326 lies along a fourth plane 332 that is parallel to the first plane 336 and the second plane 334 and perpendicular to the third plane 338.

As shown by the arrows, an electrical current flows through the P lead frame 208 (314A), through the first portion 322 of the P bus bar 304 (316A), through the third portion 326 of the P bus bar 304 (320A), through the second portion 328 of the N bus bar 306 (320B), through the first portion 330 of the N bus bar 306 (316B), and through the N lead frame 206 (314B).

Each current flow has a complementary opposite current flow to reduce parasitic inductance. The current flow 314A is complemented by current flow 314B, current flow 316A is complemented by current flow 316B, current flow 318A is complemented by current flow 318B, and current flow 320A is complemented by current flow 320B.

FIG. 3B is a magnified view of the power card 200. A first heat sink 302A is connected to the body portion 230 of the P lead frame 208 and a second heat sink 302B is connected to the body portion 232 of the N lead frame 206. The heat sinks 302 are configured to cool the respective lead frames.

FIG. 3C is a perspective view of the system 300. The power card 200 has a width 312, and the P bus bar 304, the N bus bar 306, and the capacitor 308 have a width 310. The width 310 may be as wide as the application of the system 300 will allow, in order to reduce current density through the P bus bar 304, the N bus bar 306, and the capacitor 308. The terminal portions of the N lead frame 206, the P lead frame 208, and the O lead frame 204 may also be as wide as possible to reduce current density. As compared to the N power terminal 106, the P power terminal 108, and the O power terminal 104, the terminal portions of the N lead frame 206, the P lead frame 208, and the O lead frame 204 are at least twice as wide. The N power terminal 106, the P power terminal 108, and the O power terminal 104 may be half the width of the power device, and the terminal portions of the N lead frame 206, the P lead frame 208, and the O lead frame 204 may be as wide as the power device.

Simulations of the systems described herein using power card 200 demonstrate a significant decrease in inductance compared to the power card 100. The inductance from the power card 200 is 1.90 nH, compared to 19.3 nH of the power card 100. Thus, the power card 200 reduces inductance by 90% and volume by 49% compared to power card 100.

Figure 4A:
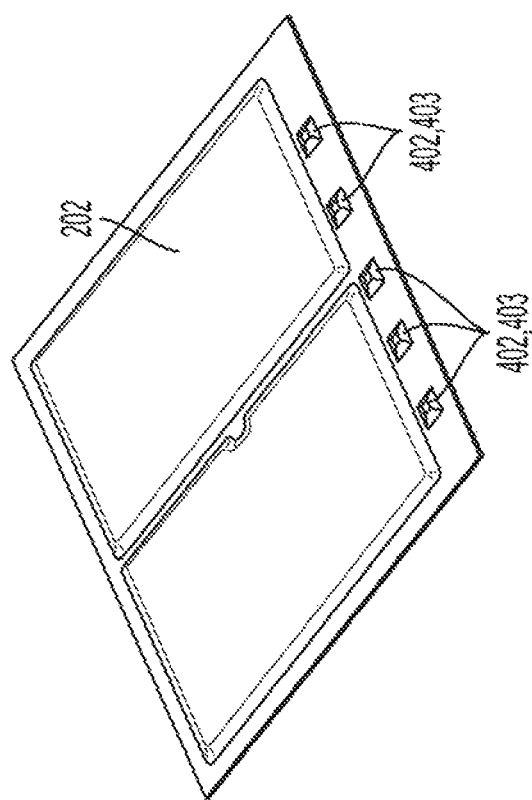

FIGS. 4A-4D illustrate a process of manufacturing the power card 200. FIG. 4A shows a power device 202 having signal pads 402. The signal pads 402 are configured to connect to signal terminals of a set of signal terminals (e.g., set of signal terminals 212). Solder 403 is applied to the signal pads 402.

FIG. 48 illustrates solder being applied to the O lead frame 204 and the N lead frame 206. The O lead frame 204 and the N lead frame 206 are placed in a lower moat 408 and an upper moat 406 is removably placed on top of the O lead frame 204 and the N lead frame 206. In particular, the O lead frame 204 is placed in and received by a cavity 416 formed in the lower moat 408, and the N lead frame 206 is placed in and received by a cavity 414 formed in the lower moat 408. A first side (or "top side" or "upper side") 458 of the O lead frame 204 contacts the upper most 406 and a second side (or "bottom side" or "lower side") 460 of the O lead frame 204 contacts the lower moat 408. Similarly, a first side (or "top side" or "upper side") 452 of the N lead frame 206 contacts the upper moat 406 and a second side (or "bottom side" or "lower side") 454 of the N lead frame 206 contacts the lower moat 408.

The O lead frame 204 has an elevated heat spreader 214 formed integrally in the body portion 228 of the O lead frame 204. Similarly, the N lead frame 206 has an elevated heat spreader 214 formed integrally in the body portion 232 of the N lead frame 206. The elevated heat spreader 214 of the O lead frame 204 has a surface 456 and the elevated heat spreader 214 of the N lead frame 206 also has a surface 450.

When the O lead frame 204 and the N lead frame 206 are located between the upper moat 406 and the lower moat 408, the surface 456 of the O lead frame 204 and the surface 450 of the N lead frame 206 are exposed via an O lead frame opening 410 and an N lead frame opening 412, respectively, of the upper moat 406. When the surface 456 of the O lead frame 204 and the surface 450 of the N lead frame 206 are exposed, solder 418 may be applied to the surface 456 of the O lead frame 204 and the surface 450 of the N lead frame 206.

Similarly, when the O lead frame 204 and the N lead frame 206 are located between the upper moat 406 and the lower moat 408, portions of the body portions of the O lead frame 204 and the N lead frame 206 may be exposed via openings 428 of the upper moat 406. Solder 404 may be applied to the exposed portions of the body portions of the O lead frame 204 and the N lead frame 206 via the openings 428 of the upper moat 406.

The upper moat 406, lower moat 408, the O lead frame 204, the N lead frame 206, and the solder 404, 418 are heated so that the solder 404, 418 attaches to its respective contacting surfaces on the O lead frame 204 and the N lead frame 206. The solder 418 will be used to couple the respective lead frame to a respective power device 202, and the solder 404 will be used to secure a respective set of signal terminals 212 to the respective lead frame.

Once the solder has cooled and set, the upper moat 406 is removed, and the O lead frame 204 and the N lead frame 206 are removed from the lower moat 408.

FIG. 4C illustrates power devices 202 being connected to the O lead frame 204 and the N lead frame 206. As compared to FIG. 4B, the O lead frame 204 and the N lead frame 206 are turned upside down, such that the first side 458 of the O lead frame 204 faces downward and the second side 460 of the O lead frame 204 faces upward, and the first side 452 of the N lead frame 206 faces downward and the second side 454 of the N lead frame 206 faces upward.

A moat 420 has a first cavity 422 for receiving solder 426 and a second cavity 424 also for receiving solder 426. A first power device 202A is placed on top of the solder 426 in the first cavity 422. More specifically, a second side 482 of the first power device 202A contacts the solder 426.

The N lead frame 206 is placed on top of the first side 480 of the first power device 202A. The solder 418 on the first side 452 of the N lead frame 206 contacts the first side 480 of the first power device 202A and couples the first power device 202A to the N lead frame 206.

Sandwiched between the first power device 202A and the N lead frame 206 is a set of signal terminals 212. The set of signal terminals 212 has a plurality of signal terminals 466 and a set of testing terminals 464 used to test the power card. The signal terminals 466 of the set of signal terminals 212 are connected to the signal pads 402 of the first power device 202A using solder 403. The testing terminals 464 are connected to the body portion 232 of the N lead frame 206 via solder 404. In some embodiments, there are no testing terminals 464, and only signal terminals 466. In some embodiments, there is only one signal terminal instead of the set of signal terminals, where the single signal terminal is a gate signal used for switching the first power device 202A on and off.

A second power device 202B is placed on top of the solder 426 in the second cavity 424. More specifically, a second side 482 of the second power device 202B contacts the solder 426.

The O lead frame 204 is placed on top of the first side 480 of the second power device 202B. The solder 418 on the first side 458 of the O lead frame 204 contacts the first side 480 of the second power device 202B and couples the second power device 202B to the O lead frame 204.

Sandwiched between the second power device 202B and the O lead frame 204 is a set of signal terminals 212. The set of signal terminals 212 has a plurality of signal terminals 466 and a set of testing terminals 464 used to test the power card. The signal terminals 466 of the set of signal terminals 212 are connected to the signal pads 402 of the second power device 202B using solder 403. The testing terminals 464 are connected to the body portion 228 of the O lead frame 204 via solder 404. In some embodiments, them are no testing terminals 464, and only signal terminals 466. In some embodiments, there is only one signal terminal instead of the set of signal terminals, where the single signal terminal is a gate signal used for switching the second power device 202B on and off.

All of the components are heated so that the solder can attach to its respective contacting surfaces. The N lead frame 206 having the first power device 202A attached to it and the O lead frame 204 having the second power device 202B attached to it are removed from the moat 420 once the solder has cooled and set.

Figure 4B:
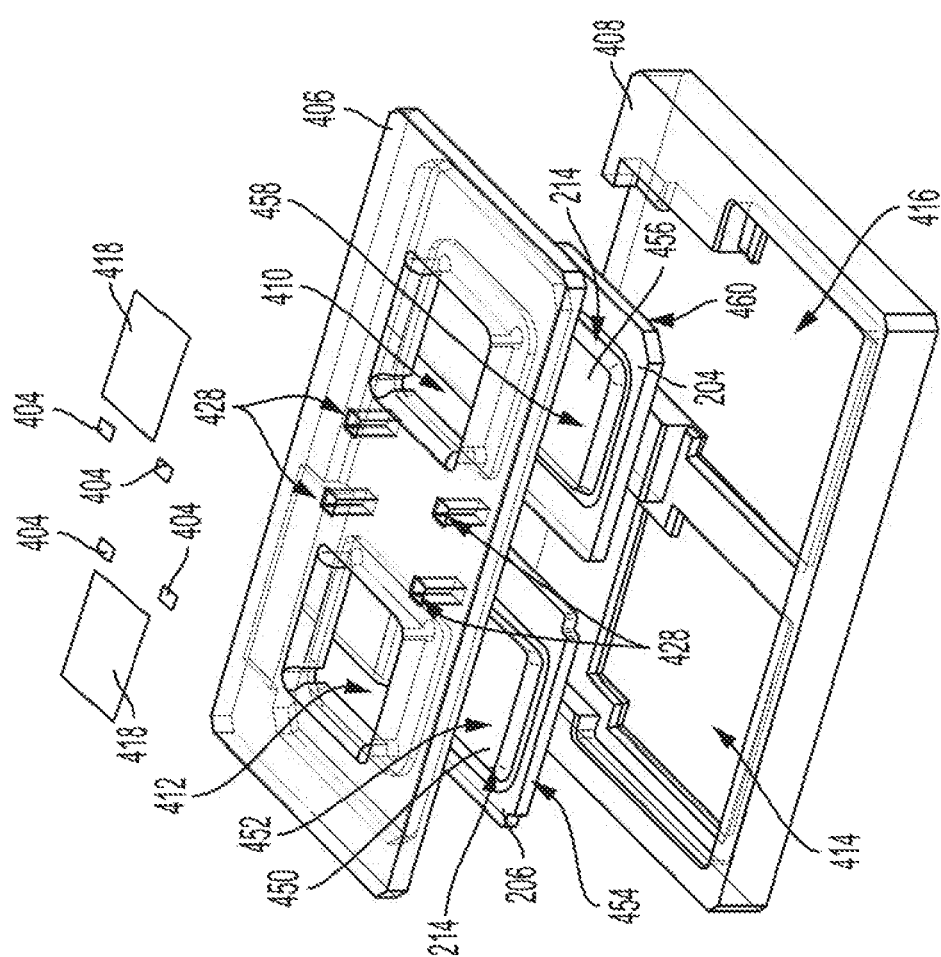
Figure 4D:
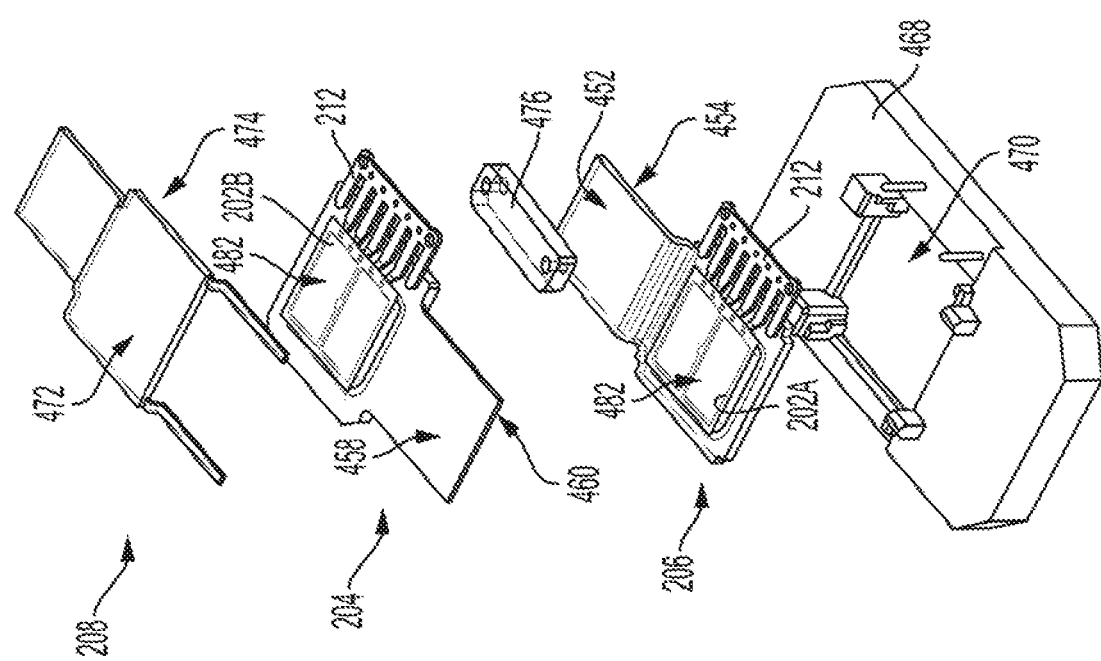

FIG. 4D illustrates the P lead frame 208, the O lead frame 204, and the N lead frame 206 being combined into the power card 200. The moat 468 has a cavity 470 configured to receive the N lead frame 206. In particular, the second side 454 of the N lead frame 206 contacts the cavity 470 of the moat 468. The first side 452 of the N lead frame 206 faces the second side 460 of the O lead frame 204. The second side 482 of the first power device 202A faces the second side 460 of the O lead frame 204 and connects to the body portion 228 of the O lead frame 204 via solder 426.

The first side 458 of the O lead frame 204 faces the second side 474 of the P lead frame 208. The second side 482 of the second power device 202B faces the second side 474 of the P lead frame 208 and connects to the body portion 230 of the P lead frame 208 via solder 426. The first side 472 of the P lead frame 208 faces upward.

All of the components are heated so that the solder can attach to its respective contacting surfaces. A spacer 476 may temporarily be disposed between the two sets of signal terminals 212 to provide support for the sets of signal terminals 212 while the solder connecting the sets of signal terminals 212 to the lead frame and power device cools and sets. An insulator 220 may be disposed between the terminal portion 224 of the P lead frame 208 and the terminal portion 226 of the N lead frame 206.

Once the solder has set, the spacer 476 is removed, and the intermediate assembly including the P lead frame 208, the O lead frame 204, the N lead frame 206, the first power device 202A, the second power device 202B, the sets of signal terminals 212, and the solder disposed therebetween, may be placed in a mold. The resin 210 may be injected into the mold such that the resin 210 fills all gaps between components of the intermediate assembly. Once the resin 210 is cured, additional finishing steps (e.g., cutting the resin to expose metal parts on the top and bottom of the power card, signal terminal cutting, cleaning) may be performed, and the power card 200 fabrication is complete.

As described herein, the resin 210 may not cover all of the components of the power card 200. In particular, the resin 210 may not cover the terminal portion 222 of the O lead frame 204, the top surface of the terminal portion 224 of the P lead frame 208 (e.g., the terminal portion 224 of the first side 472 of the P lead frame 208), and the bottom surface of the terminal portion 226 of the N lead frame 206 (e.g., the terminal portion 226 of the second side 454 of the N lead frame 206).

Any of the moats (e.g., upper moat 406, lower moat 408, moat 420, moat 468) may be made of graphite or other similar durable materials. The moats may also have any number of support features for supporting and framing the components received in the moat cavity, as shown in FIGS. 4B-4D.

Because of the stacked arrangement of the power devices 202, the power card 200 may generate significant amounts of heat. In some embodiments, cooling may be provided on both sides of each power device 202 to improve the cooling of the power card 200. When the power card 200 is not sufficiently cooled, thermal resistivity may rise, and the power card 200 may not operate as efficiently.

Figure 5A:
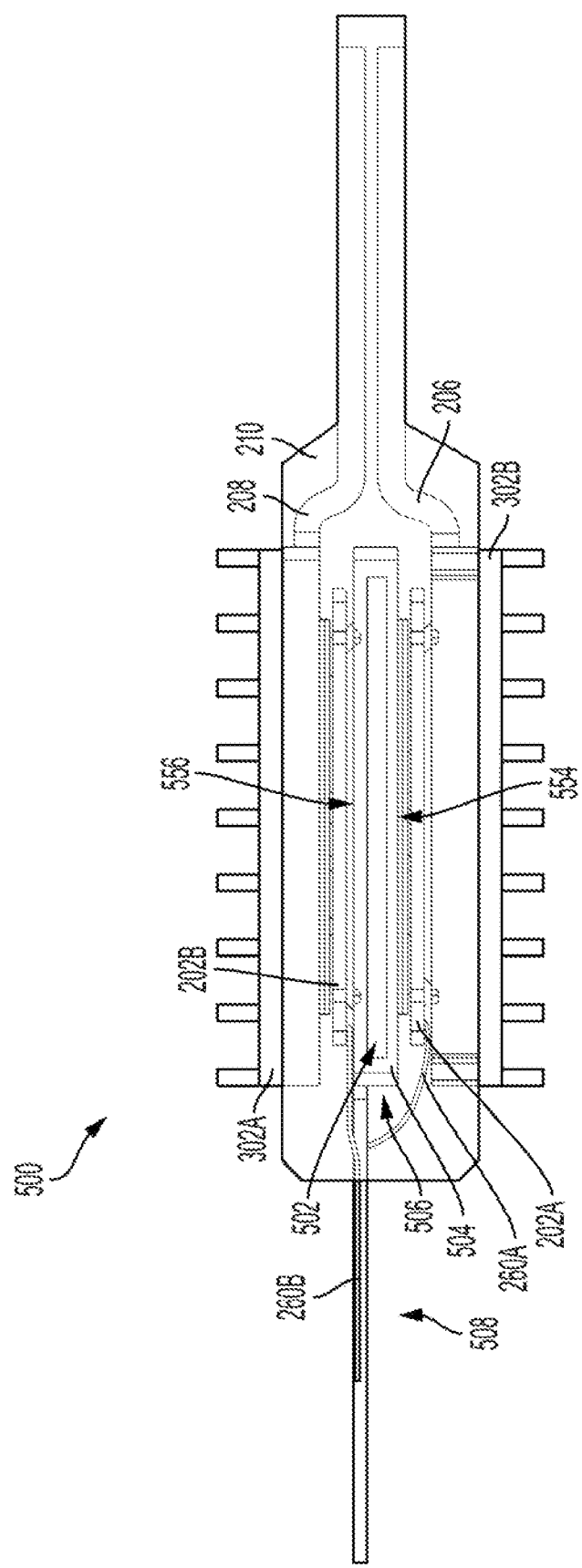
FIGS. 5A-5C illustrate a compact low inductance chip-on-chip power card with an O lead frame with integrated channels, according to various embodiments of the invention.

FIG. 5A illustrates a side view of a power card 500 having an O lead frame 504 with integrated cooling. The power card 500 is similar to power card 200 described herein. Components of power card 200 that are different in power card 500 may be numbered with different reference numbers than those used with respect to power card 200.

Power card 500 includes P lead frame 208, N lead frame 206, a first power device 202A, a second power device 202B, a single signal terminal 260A for the first power device 202A, a single signal terminal 260B for the second power device 202B, a first heat sink 302A, and a second heat sink 302B, each as described herein. These components, along with the O lead frame 504 are encased in resin 210, as described herein.

The O lead frame 504 has a body portion 506 and a terminal portion 508 extending outward from the body portion 506. The first power device 202A is coupled to a first side 554 of the O lead frame 504 (specifically, the body portion 506 of the O lead frame) and the second power device 202B is coupled to a second side 556 of the O lead frame 504 (specifically, the body portion 506 of the O lead frame).

The body portion 506 of the O lead frame 504 includes an O channel 502, which may be one or more channels. The O channel 502 is configured to receive cooling liquid and allow the cooling liquid to pass through the O channel 502. When the cooling liquid is within the O channel 502, the cooling liquid absorbs heat emitted from the first power device 202A and the second power device 202B. The now-heated cooling liquid exits the O channel 502 to be cooled, and as the now-heated cooling liquid exits the O channel 502, new, cooler cooling liquid takes its place in the O channel 502 for absorbing heat. The cooling liquid may be any liquid capable of being heated and cooled efficiently, such as dielectric coolant or oil.

The combination of the heat sinks 302 and the O lead frame 504 with channels 502 provides cooling to both sides of each power device 202. That is, the first power card 202A is cooled on a first side by the second heat sink 302B and on a second side by the O lead frame 504, and the second power card 202B is cooled on a first side by the O lead frame 504 and on a second side by the first heat sink 302A.

Figure 5B:
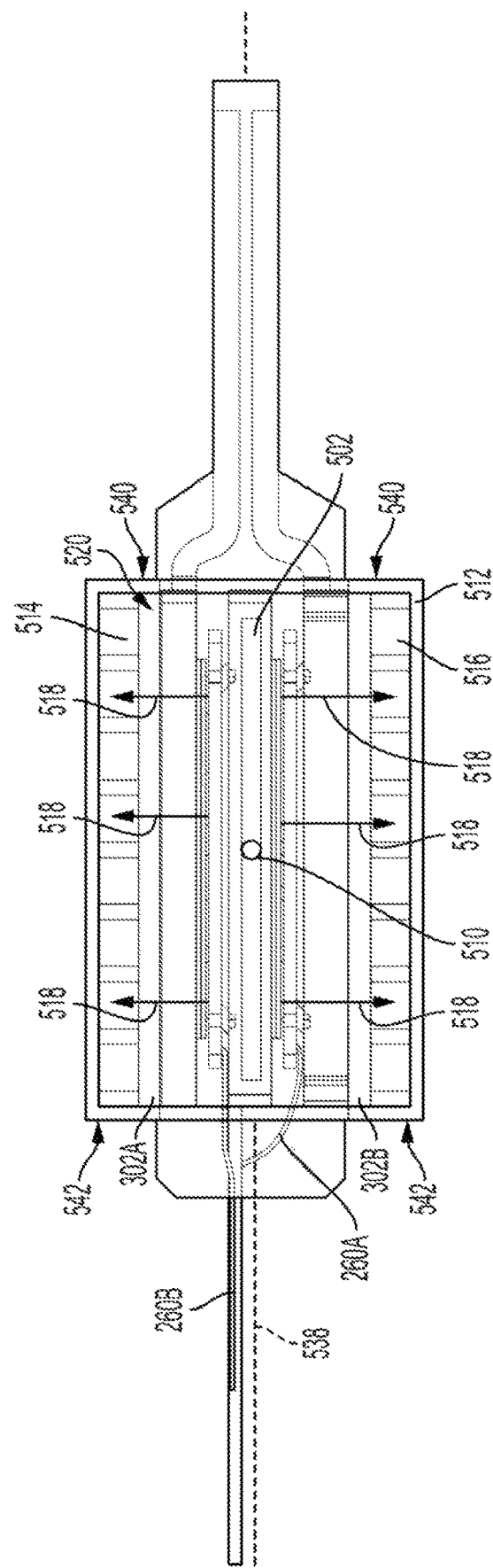

FIG. 5B illustrates the power card 500 with a manifold 512 located around a central portion of the power card 500. The central portion of the power card 500 may be delineated by the body portions of the P lead frame 208, the N lead frame 206, and the O lead frame 504 along a centerline axis 538 of the power card 500.

The manifold 512 may surround and encase a central portion of the power card 500, wrapping around the central portion of the power card 500, to form multiple fluidly coupled channels, including the O channel 502. The multiple channels may include a top channel 514 and a bottom channel 516. The top channel 514 may be located radially outward of the body portion 230 of the P lead frame 208, relative to the centerline axis 538. The bottom channel 516 may be located radially outward of the body portion 232 of the N lead frame 206, relative to the centerline axis 538. The top channel 514 and the bottom channel 516 may each be defined by an interior surface of the manifold 512 and an exterior of the power card 500.

Further, the top channel 514 may be a plurality of channels defined by the fins 552 of the first heat sink 302A, and the bottom channel 516 may be a plurality of channels defined by the fins 552 of the second heat sink 302B. That is, the top channel 514 may be a plurality of channels having a bottom and side surface defined by the fins 552 of the first heat sink 302A and a top surface defined by an interior surface of the manifold 512, and the bottom channel 516 may be a plurality of channels having a top and side surface defined by the fins 552 of the second heat sink 302B and a bottom surface defined by an interior surface of the manifold 512. The top channel 514 and the bottom channel 516 may lie on planes that are parallel to the planes that the lead frames lie on.

The top channel 514 is configured to receive cooling liquid and allow the cooling liquid to pass through the top channel 514. When the cooling liquid is within the top channel 514, the cooling liquid absorbs heat emitted from the second power device 202B and the first heat sink 302A. The now-heated cooling liquid exits the top channel 514 to be cooled, and as the now-heated cooling liquid exits the top channel 514, new, cooler cooling liquid takes its place in the top channel 514 for absorbing heat.

The bottom channel 516 is configured to receive cooling liquid and allow the cooling liquid to pass through the bottom channel 516. When the cooling liquid is within the bottom channel 516, the cooling liquid absorbs heat emitted from the first power device 202A and the second heat sink 302B. The now-heated cooling liquid exits the bottom channel 516 to be cooled, and as the now-heated cooling liquid exits the bottom channel 516, new, cooler cooling liquid takes its place in the bottom channel 516 for absorbing heat.

The manifold 512 also includes an inlet port 510 for receiving the cooling liquid for passing through the O channel 502, the top channel 514, and the bottom channel 516. A vertically oriented inlet side channel 520 may fluidly connect the inlet port to the top channel 514 and the bottom channel 516, allowing the cooling liquid to flow 518 to the top channel 514 and the bottom channel 516 when received via the inlet port 510. The resin 210 encasing the power card 500 prevents the cooling liquid from contacting components of the power card 500 other than the O channel 502, the top channel 514, and the bottom channel 516. In particular, the cooling liquid does not contact the power devices 202 or the P lead frame 208 or the N lead frame 206.

The manifold 512 also includes an outlet port on an opposite side of the inlet port 510 for expelling the used cooling liquid from the O channel 502, the top channel 514, and the bottom channel 516. A vertically oriented outlet side channel may fluidly connect the outlet port to the top channel 514 and the bottom channel 516.

The top channel 514, bottom channel 516, inlet side channel 520, and outlet side channel may span substantially the entire length of the manifold 512 or may span a portion of the manifold 512. The O channel 502, the top channel 514, and the bottom channel 516 may span substantially the entire width of the manifold 512. The top channel 514, bottom channel 516, inlet side channel 520, and outlet side channel may include multiple channels or may be single respective channels.

The manifold 512 may also include a front face 540 and a rear face 542 that are parallel to each other and perpendicular to the respective planes that the top channel 514, bottom channel 516, inlet side channel 520, and outlet side channel lie on.

Since the cooling is direct liquid cooling, heat from the power devices 202 will be absorbed by the cooling liquid and the heat will not pass through the manifold 512. Thus, the manifold 512 may be made of a non-thermally/electrically conductive material, such as PEEK or plastic. The insulated manifold material and use of a dielectric coolant reduce the possibility for a short circuit.

Figure 5C:
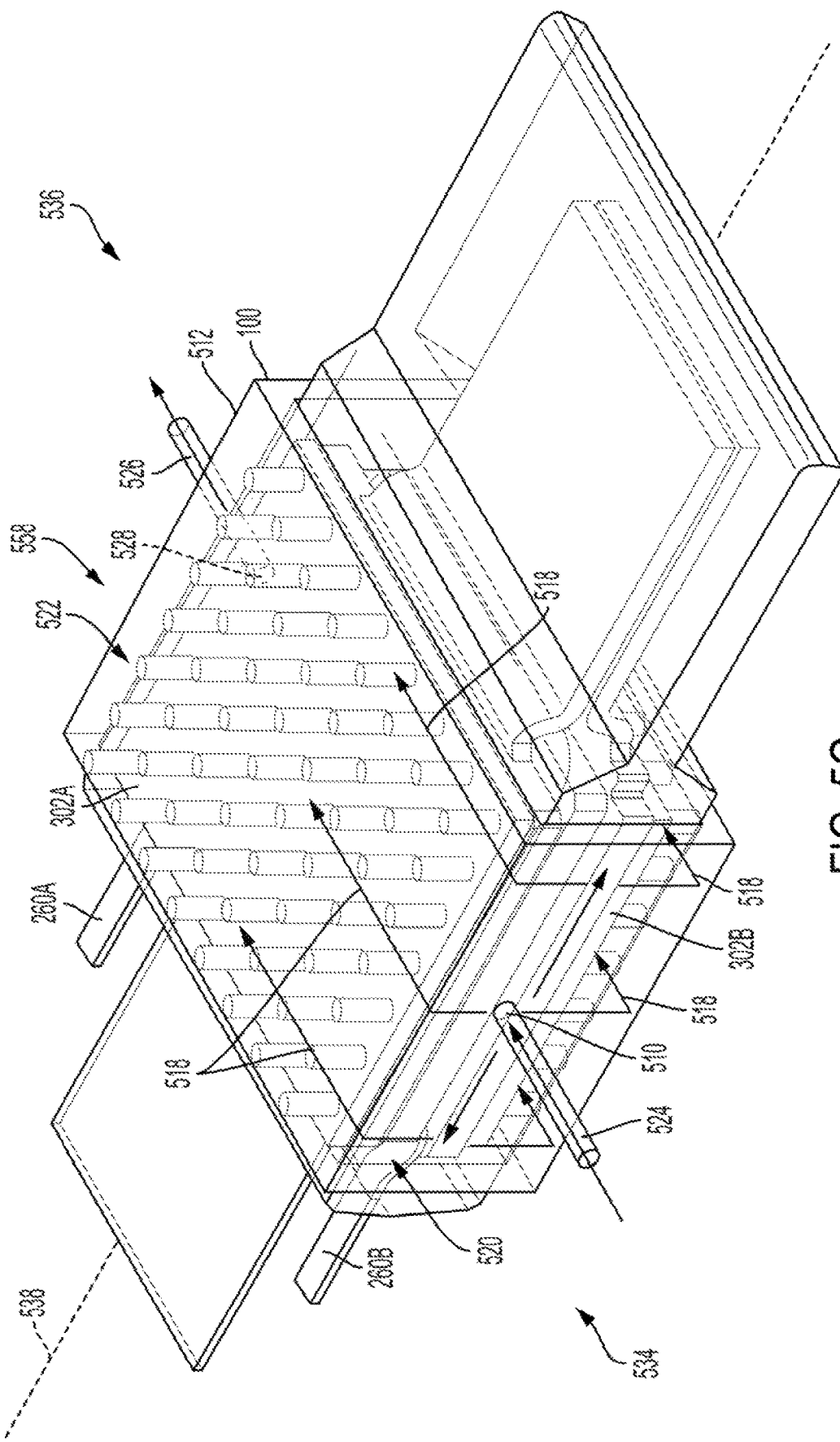

FIG. 5C illustrates a perspective view of the power card 500 shown in FIG. 5B. In particular, FIG. 5C shows the outlet port 528 and the outlet side channel 522. The manifold 512 spans a lengthwise periphery 558 of the body portion 232 of the N lead frame 206, the body portion 230 of the P lead frame 208, and the body portion 506 of the O lead frame 504.

The inlet port 510 is coupled to an inlet tube 524. The inlet tube 524 connects to a cooling device that provides the cooling liquid to flow 518 through the channels of the manifold and the channels of the O lead frame 504. The outlet port 528 is coupled an outlet tube 526. The outlet tube 526 connects to the cooling device that receives the used cooling liquid that flowed through the channels of the manifold and the channels of the O lead frame 504 and absorbed heat from the first power device 202A and the second power device 202B. The cooling device cools the used cooling liquid and provides the cooled cooling liquid to the manifold 512 via the inlet tube 524.

While the inlet port 510 and the inlet tube 524 are shown as being on the first lengthwise edge 534 and the outlet port 528 and the outlet tube 526 are shown as being on the second lengthwise edge 536, in other embodiments, the inlet port 510 and the inlet tube 524 may be on the second lengthwise edge 536 and the outlet port 528 and the outlet tube 526 may be on the first lengthwise edge 534. In other embodiments, the inlet port 510 and the inlet tube 524 may be on another surface of the manifold 512 and the outlet port 528 and the outlet tube 526 may be on yet another surface of the manifold 512.

As the inlet port 510, inlet tube 524, outlet port 528, and outlet tube 526 occupy the lengthwise edges of the power card 500, (e.g., signal terminals 212 of FIGS. 2A-2B) may not be located on either lengthwise edge, and single signal terminals 260 for each of the power devices 202 are located on either side of the terminal portion of the O lead frame.

Figure 5D:
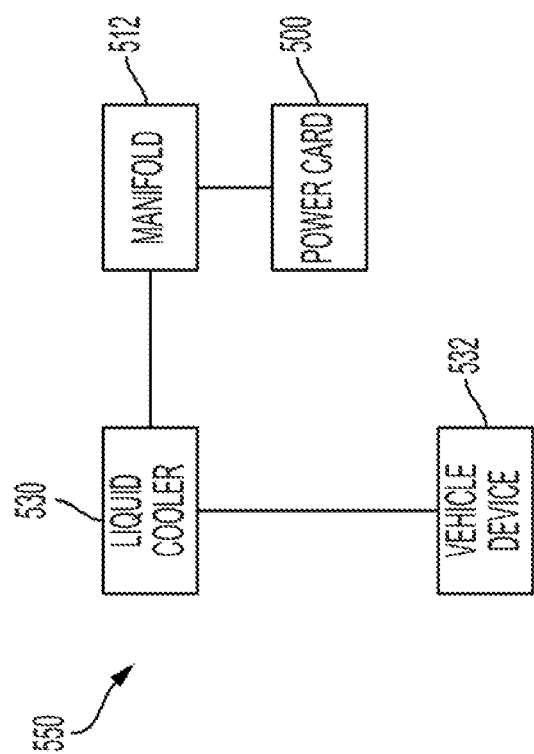
FIG. 5D illustrates a system using the compact low inductance chip-on-chip power card with an O lead frame with integrated channels, according to various embodiments of the invention.

FIG. 5D is a block diagram of a system 550 using the power card 500. The power card 500 is connected to the manifold 512, as described herein. The manifold 512 is connected to a liquid cooler 530, which provides cooled cooling liquid to the manifold 512 and receives used cooling liquid from the manifold 512. The liquid cooler 530 cools the used cooling liquid and provides the cooled liquid to the manifold 512. The liquid cooler 530 may cool the used cooling liquid using a radiator, for example.

The liquid cooler 530 is also connected to a vehicle device 532 and circulates cooling liquid to the vehicle device 532 to cool components of the vehicle device 532. The vehicle device 532 may be any vehicle component that generates heat, such as an electronic control unit, a motor, a brake, or an engine, for example. By using a single liquid cooler 530 across multiple devices (e.g., power card 500 and vehicle device 532), the vehicle is able to reduce complexity, cost, weight, and maintenance demand, among other things.

When the vehicle device 532 is a motor powering a wheel of a vehicle, the system 550 may be sufficiently compact to be located proximal to the wheel of the vehicle. The vehicle may include additional similar systems 550 for each wheel.

Figure 6:
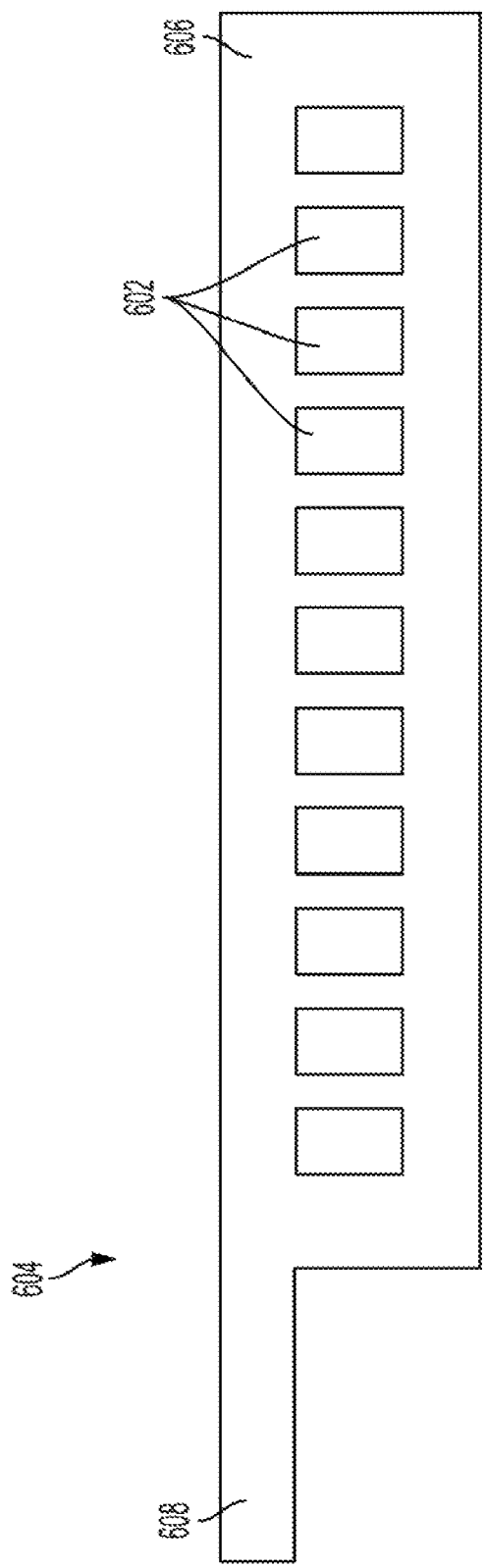
FIG. 6 illustrates an O lead frame with integrated channels, according to various embodiments of the invention.

FIG. 6 illustrates an O lead frame 604 similar to O lead frame 504. The O lead frame 604 includes a plurality of channels 602 (similar to O channel 502) for receiving cooling liquid. The channels 602 may be formed in the body portion 606 (similar to body portion 506) of the O lead frame 604. The O lead frame 604 may also include a terminal portion 608 (similar to terminal portion 508) extending from the body portion 606.

The channels 602 may span a width of the O lead frame 604. The channels 602 may each have the same cross-sectional area, or the channels 602 may have varying cross-sectional areas. The channels 602 may be straight lines through the width of the O lead frame 604 or may be curved paths traversing the body portion 606 of the O lead frame 604.

The channels 602 may be formed integrally in the body portion 606 of the O lead frame 604. The channels 602 may be etched or machined out of a solid O lead frame 604. The channels 602 may be cast using a mold that includes the channels 602. In other embodiments, the O lead frame may be constructed using multiple pieces.

Figure 7:
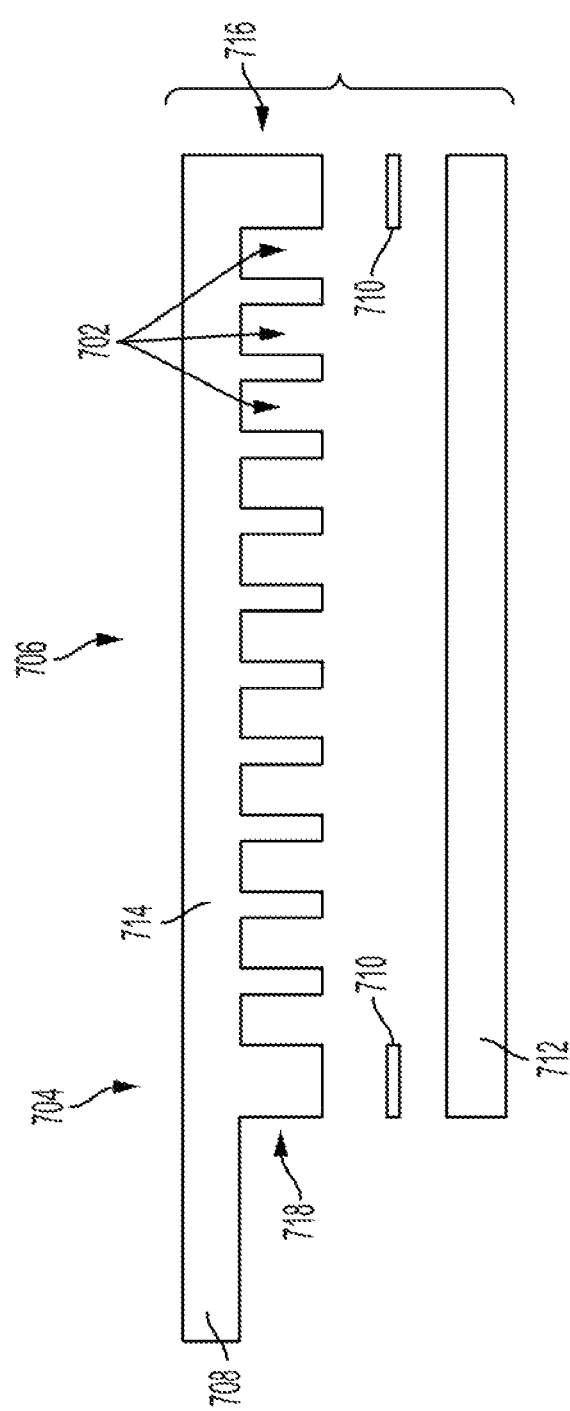
FIG. 7 illustrates an exploded O lead frame with integrated channels, according to various embodiments of the invention.

FIG. 7 illustrates an O lead frame 704 similar to O lead frame 504. The O lead frame 704 includes a plurality of channels 702 (similar to O channel 502) for receiving cooling liquid. The channels 702 may be formed in the body portion 706 (similar to body portion 506) of the O lead frame 704. The O lead frame 704 may also include a terminal portion 708 (similar to terminal portion 508) extending from the body portion 706.

The channels 702 may span a width of the O lead frame 704. The channels 702 may each have the same cross-sectional area, or the channels 702 may have varying cross-sectional areas. The channels 702 may be straight lines through the width of the O lead frame 704 or may be curved paths traversing the body portion 706 of the O lead frame 704.

The O lead frame 704 may be made of two components—a top portion 714 and a bottom portion 712. The top portion 714 includes the terminal portion 708 and the channels 702 formed integrally within the top portion 714. The bottom portion 712 is substantially flat and forms the base of the O lead frame 704. The bottom portion 712 may be attached to the top portion 714 along a front edge 716 and a rear edge 718 using solder 710.

When the O lead frame is a single piece, such as O lead frame 604, manufacture of a power card 500 is similar to the manufacture of power card 200, as described in FIGS. 4A-4D. The primary changes would be manufacture of the O lead frame 504 described herein and a modified mold for the resin 210.

When the O lead frame is made of multiple pieces, such as O lead frame 704, manufacture of a power card 500 may be made simpler than the process described in FIGS. 4A-4D. The top portion 714 may be substituted for the O lead frame 204 as shown in FIGS. 4B and 4C and described herein. Then, instead of performing a solder reflow process of the entire power card, as shown in FIG. 4D, a first sub-card and second sub-card are fabricated.

The first sub-card has the P lead frame 208, the second power device 202B, a single signal terminal 260, the top portion 714 of the O lead frame 704, and solder located between the P lead frame 208 and the second power device 202B, solder located between the second power device 202B and the top portion 714 of the O lead frame 704, and solder connecting a contact pad of the second power device 202B to the single signal terminal 260. The components of the first sub-card may be soldered together using a moat and heating the first sub-card in the moat, to create reflow soldering.

The second sub-card has the N lead frame 206, the first power device 202A, a single signal terminal 260, the bottom portion 712 of the O lead frame 704, and solder located between the N lead frame 206 and the first power device 202A, solder located between the first power device 202A and the bottom portion 712 of the O lead frame 704, and solder connecting a contact pad of the first power device 202A to the single signal terminal 260. The components of the second sub-card may be soldered together using a moat and heating the second sub-card in the moat, to create reflow soldering.

The first sub-card and the second sub-card may then be connected using solder 710, as shown in FIG. 7 to complete fabrication of the power card.

In addition to or in lieu of the O lead frame 504 with the O channel 502, the O lead frame may be made of a material with thermal conductivity properties that allow for more efficient cooling of the O lead frame, and therefore mom efficient cooling of the power devices 202.

Figure 8:
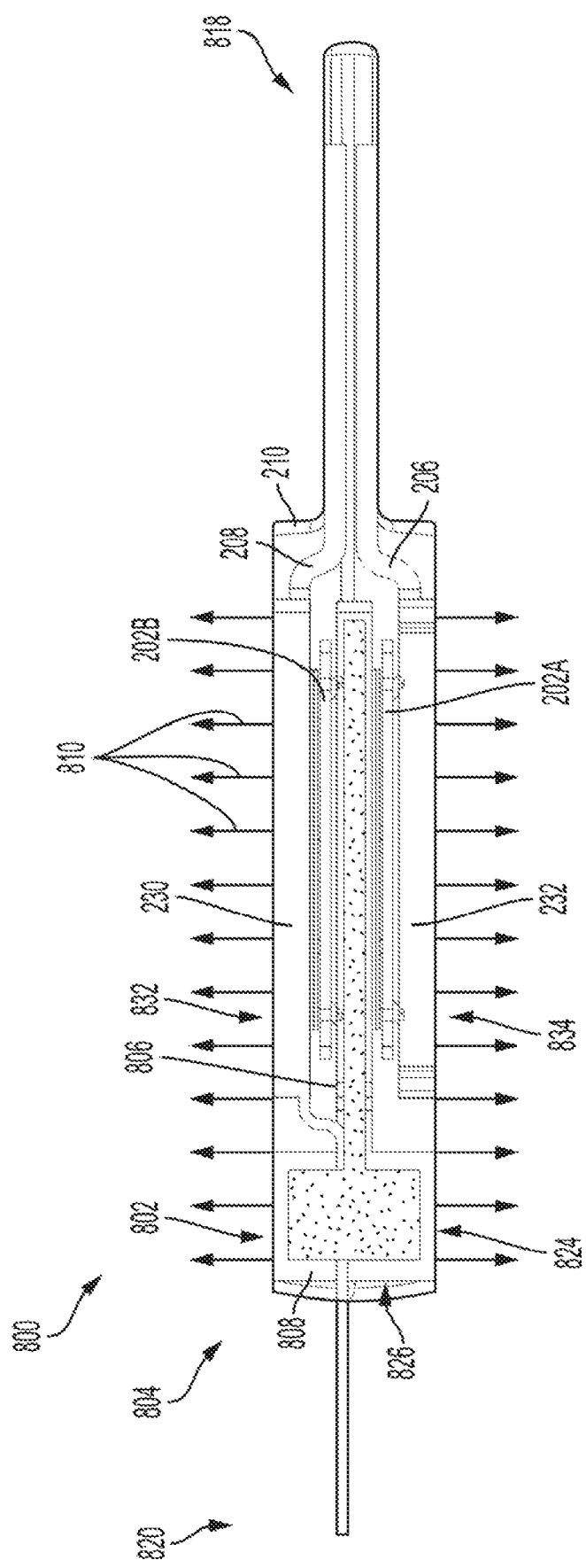
FIG. 8 illustrates a compact low inductance chip-on-chip power card with a thermally conductive O lead frame, according to various embodiments of the invention.

FIG. 8 illustrates a power card 800 that has a thermally conductive O lead frame 804. The O lead frame 804 has a body portion 806 and a cooling portion 808 extending from the body portion 806 toward a first end 820 of the power card 800. The cooling portion 808 is connected to the body portion 806 and cools the body portion 806. The power card 800 is similar to power card 200 described herein. Components of power card 200 that are different in power card 800 may be numbered with different reference numbers than those used with respect to power card 200.

Power card 800 includes a P lead frame 208 (with a body portion 230), an N lead frame 206 (with a body portion 232), a first power device 202A, a second power device 202B, and resin 210 encasing the components of the power card 800, as described herein. The N lead frame 206 and the P lead frame 208 have respective terminal portions extending from their respective body portions and toward a second end 818 of the power card 800.

The first power device 202A and the second power device 202B generate heat 810 as they operate. In particular, the heat generated from the first power device 202A passes through the body portion 230 of the P lead frame 208, and the heat generated from the second power device 202B passes through the body portion 232 of the N lead frame 206. The heat from both the first power device 202A and the second power device 202B may be encountered by the body portion 806 of the O lead frame 804. The heat encountered by the O lead frame 804 may be absorbed by the body portion 806 and cooled using the cooling portion 808.

The O lead frame 804 may be made of a highly thermally conductive material, so that the heat is efficiently conducted from the body portion 806 to the cooling portion 808. The cooling portion 808 may have a relatively large surface area for releasing the conducted heat. In particular, the cooling portion 808 may have a top surface 822 and a bottom surface 824 located radially outward of the top and bottom surfaces of the body portion 806 of the O lead frame 804, and also multiple side surfaces 826 extending between the top surface 822 and the bottom surface 824 of the cooling portion 808 of the O lead frame 804. The multiple side surfaces 826 are perpendicular to the top surface 822 and the bottom surface 824. The side surfaces 826, the top surface 822, and the bottom surface 824 create a relatively large surface area for cooling heat 810 received by the body portion 806 of the O lead frame 804.

The top surface 822 may be coplanar with a radially outermost surface 832 of the P lead frame 208 (e.g., the first side 472 of the P lead frame 208). The bottom surface 824 may be coplanar with a radially outermost surface 834 of the N lead frame 206 (e.g., second side 454 of the N lead frame 206). As such, the cooling portion 808 of the O lead frame 804 may be non-overlapping with the body portions of the P lead frame 208 and the N lead frame 206.

In some embodiments, the cooling portion 808 is also attached to separate cooling devices, such as heat sinks or liquid cooling devices to further improve cooling.

Figure 9:
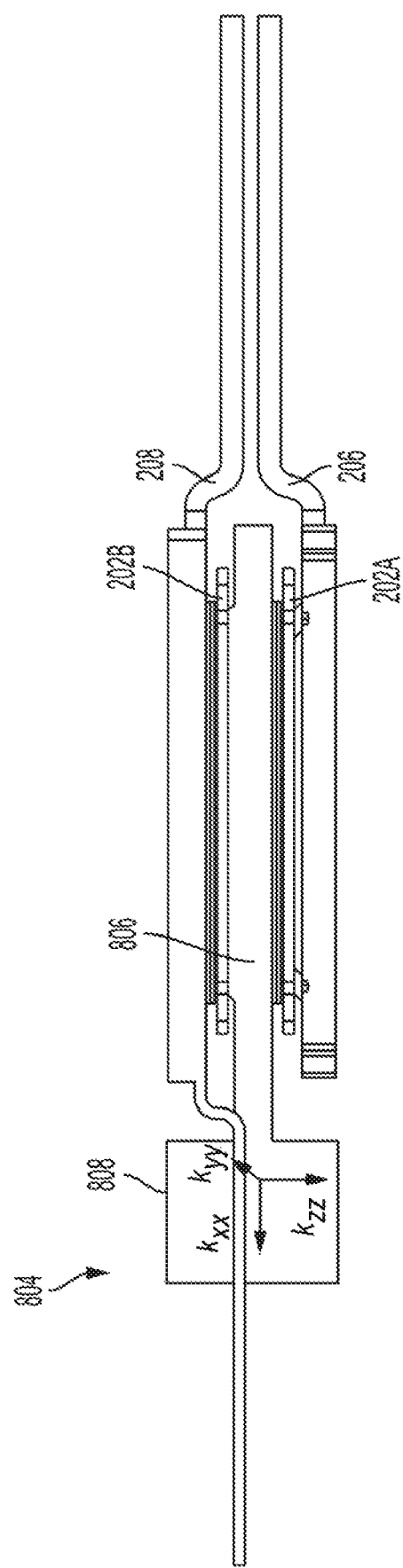
FIG. 9 illustrates a compact low inductance chip-on-chip power card with a graphite O lead frame, according to various embodiments of the invention.

FIG. 9 illustrates an O lead frame 804 made of graphite. The thermal conductivity of graphite is not homogeneous. Graphite has high thermal conductivity in two axes, but low thermal conductivity along a third axis. The thermal conductivity properties of the O lead frame 804 is shown on the 3-dimensional axes as $k_{xx}$, $k_{yy}$, and $k_{zz}$. The thermal conductivity along the lengthwise axis of the O lead frame (e.g., axis 538) is represented by $k_{xx}$. The thermal conductivity along the widthwise axis of the O lead frame 804 is represented by $k_{yy}$. The thermal conductivity along the vertical axis of the O lead frame 804 is represented by $k_{zz}$. The O lead frame 804 may be made so that the two axes of the graphite with high thermal conductivity are $k_{xx}$ and $k_{zz}$ and the axis with low thermal conductivity is $k_{yy}$.

Figure 10:
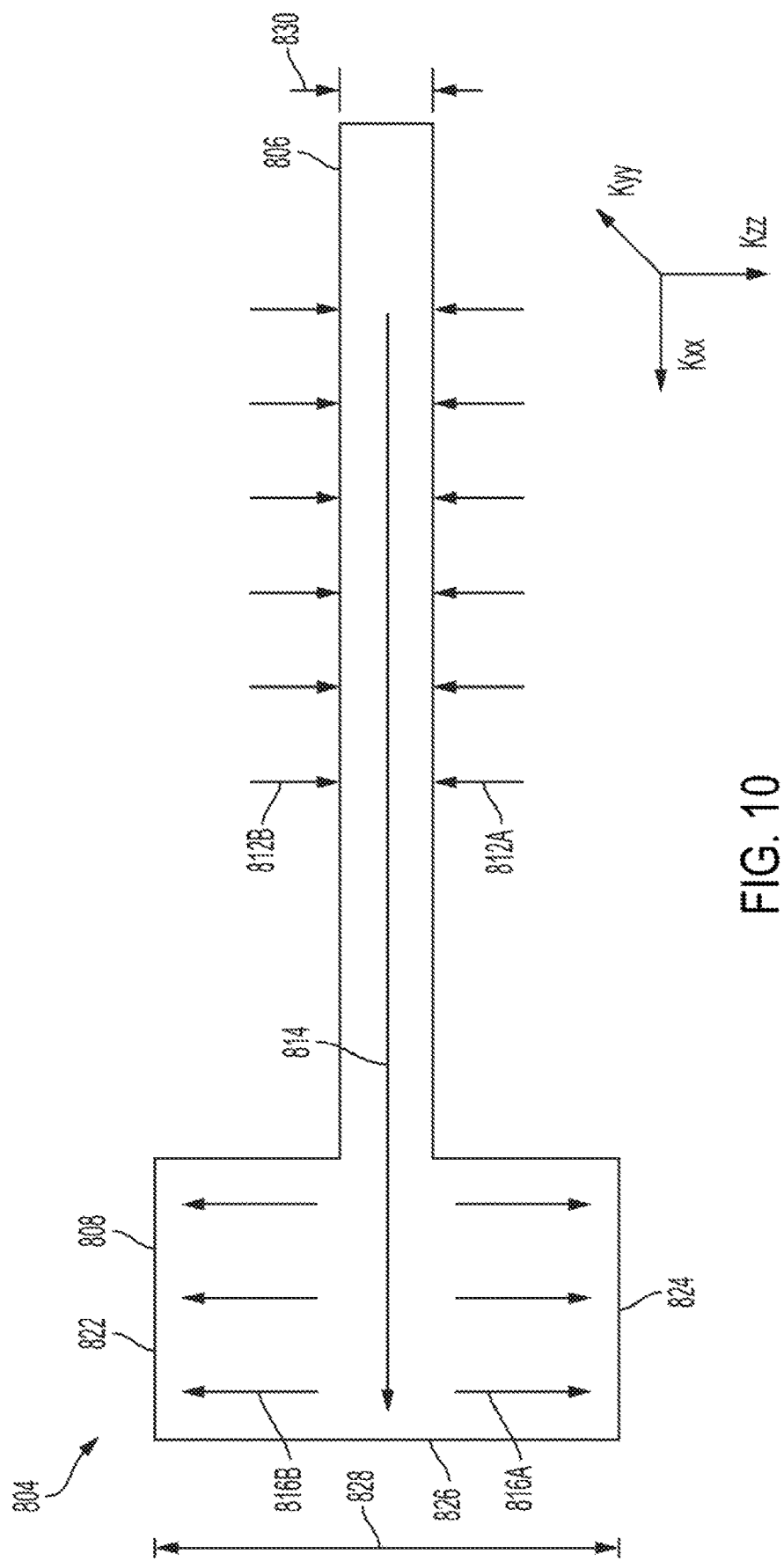
FIG. 10 illustrates a graphite O lead frame, according to various embodiments of the invention.

As shown in FIG. 10, heat 812A received by the body portion 806 of the O lead frame 804 from the first power device 202A and the heat 812B received by the body portion 806 of the O lead frame 804 from the second power device 202B are easily absorbed by the O lead frame 804 (along the $k_{zz}$ axis). The heat 814 is efficiently directed toward the cooling portion 808 (along the $k_{xx}$ axis) which is cooler than the body portion 806. The heat 816A is then directed (along the $k_{zz}$ axis) to the bottom surface 824 (or attached cooling device) and the heat 816B is directed (along the $k_{zz}$ axis) to the top surface 822 (or attached cooling device). The heat 814 may also continue to the side surfaces 826 (along the $k_{xx}$ axis).

A thickness 828 of the cooling portion 808 may be greater than a thickness 830 of the body portion 806. The increased thickness and the greater surface area described herein contribute to the cooling capabilities of the cooling portion 808.

Figure 11:
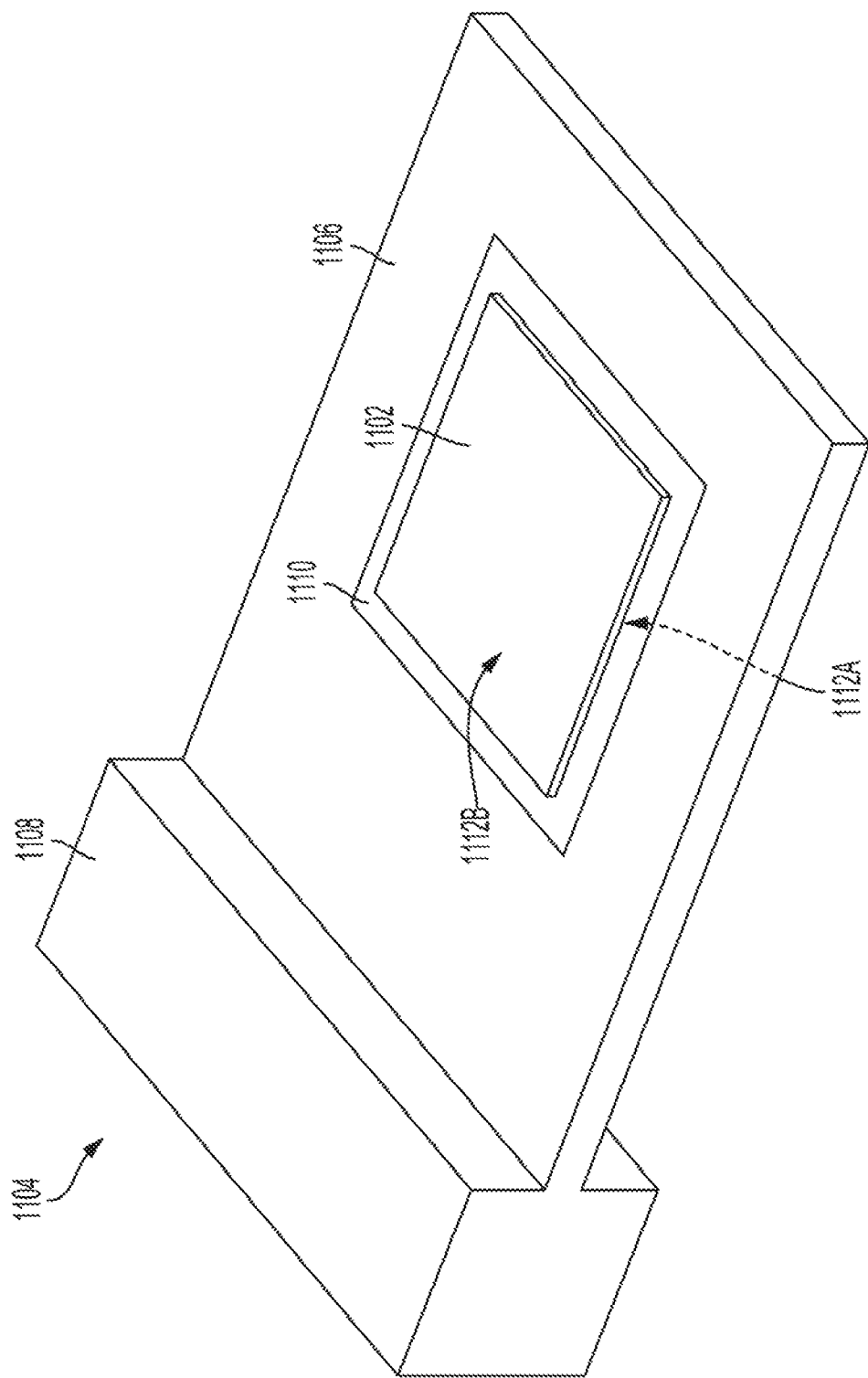
FIG. 11 illustrates a graphite and copper O lead frame, according to various embodiments of the invention.

FIG. 11 illustrates an O lead frame 1104 made of a combination of two materials. The O lead frame 1104 has a body portion 1106, a cooling portion 1108, a power device platform 1102, and a transition portion 1110. The body portion 1106 and the cooling portion 1108 are similar to body portion 806 and cooling portion 808 described herein.

The platform 1102 is configured to contact power devices 202 on either side of the platform 1102. That is, the platform 1102 has a first side 1112A configured to contact a first power device 202A and a second side 1112B opposite the first side 1112A and configured to contact a second power device 202B. FIG. 11 shows the second side 1112B of the platform 1102 and the elevation of the platform 1102 from the rest of the body portion 1106. Similarly, the platform 1102 is elevated from the rest of the body portion 1106 on the first side 1112A.

The transition portion 1110 may be optional and connects the platform 1102 to the body portion 1106. In some embodiments, the transition portion 1110 spans the thickness of the body portion 1106, such that the transition portion 1110 occupies an aperture in the body portion 1106. In other embodiments, the transition portion 1110 is located on top of the body portion 1106 on the top and bottom surfaces of the body portion 1106. In other embodiments, the transition portion 1110 spans a portion of the thickness of the body portion 1106, such that the transition portion 1110 occupies a cavity in the body portion 1106 on the top and bottom surfaces of the body portion 1106.

When the platform 1102 and the transition portion 1110 are made of the same material, the platform 1102 may be formed integrally with the transition portion 1110. When the platform 1102 and the transition portion 1110 are made of different materials, the platform 1102 may be located on top of the transition portion 1110 on the top and bottom surfaces of the transition portion 1110, or platform 1102 may occupy a cavity in the transition portion 1110 on the top and bottom surfaces of the transition portion 1110.

The body portion 1106 and the cooling portion 1108 may be made of a first material (e.g., graphite) and the platform 1102 and transition portion 1110 may be made of a second material (e.g., copper). The first material may have a greater thermal conductivity than the second material. As a result, if the power devices 202 were to generate heat unevenly (e.g., "local hot spots"), the uneven heat would be spread across the platform 1102 and the transition portion 1110 before reaching the body portion 1106. The uneven heat is spread across the platform 1102 and the transition portion 1110 more than if the platform 1102 were also made of the first material. Once the heat reaches the body portion 1106 made of the first material, the heat would be conducted as shown in FIG. 10 and described herein.

The body portion 1106, the cooling portion 1108, and the transition portion 1110 may be made of a first material (e.g., graphite) and the platform 1102 may be made of a second material (e.g., copper). The first material may have a greater thermal conductivity than the second material. As a result, if the power devices 202 were to generate heat unevenly (e.g., "local hot spots"), the uneven heat would be spread across the platform 1102 before reaching the transition portion 1110 and the body portion 1106. The uneven heat is spread across the platform 1102 more than if the platform 1102 were also made of the first material. Once the heat reaches the body portion 1106 made of the first material, the heat would be conducted as shown in FIG. 10 and described herein.

The body portion 1106 and the cooling portion 1108 may be made of a first material (e.g., graphite), the platform 1102 may be made of a second material (e.g., copper), and the transition portion 1110 may be made of a third material. The first material may have a greater thermal conductivity than the second material and the third material. As a result, if the power devices 202 were to generate heat unevenly (e.g., "local hot spots"), the uneven heat would be spread across the platform 1102 and the transition portion 1110 before reaching the body portion 1106. The uneven heat is spread across the platform 1102 and the transition portion 1110 more than if the platform 1102 or the transition portion 1110 were also made of the first material. Once the heat reaches the body portion 1106 made of the first material, the heat would be conducted as shown in FIG. 10 and described herein.

In some embodiments, the third material has a greater thermal conductivity than the second material, to transition the heat flow from the second material to the first material. In other embodiments, the third material has a lower thermal conductivity than the second material to further spread out the heat across the transition portion 1110.

In some embodiments, the O lead frame 1104 is similar to O lead frame 804 and made of the first material, but is coated with the second material. Thus, instead of the platform 1102 being made of the second material, the entire surface of the O lead frame 1104 is coated with the second material. In these embodiments, the mechanical rigidity of the O lead frame 1104 may increase.

In some embodiments, the platform 1102 is divided into two pieces, with a first piece coupled to a first side of the body portion 1106 of the O lead frame 1104 and also coupled to a first power device, and a second piece coupled to a second side of the body portion 1106 of the O lead frame 1104 and also coupled to a second power device.

In other embodiments, the platform 1102 is a single piece having a first side 1112A and a second side 1112B, and the platform 1102 spans the thickness of the body portion 1106 and is located within an aperture of the body portion 1106 of the O lead frame 1104.

Figure 12:
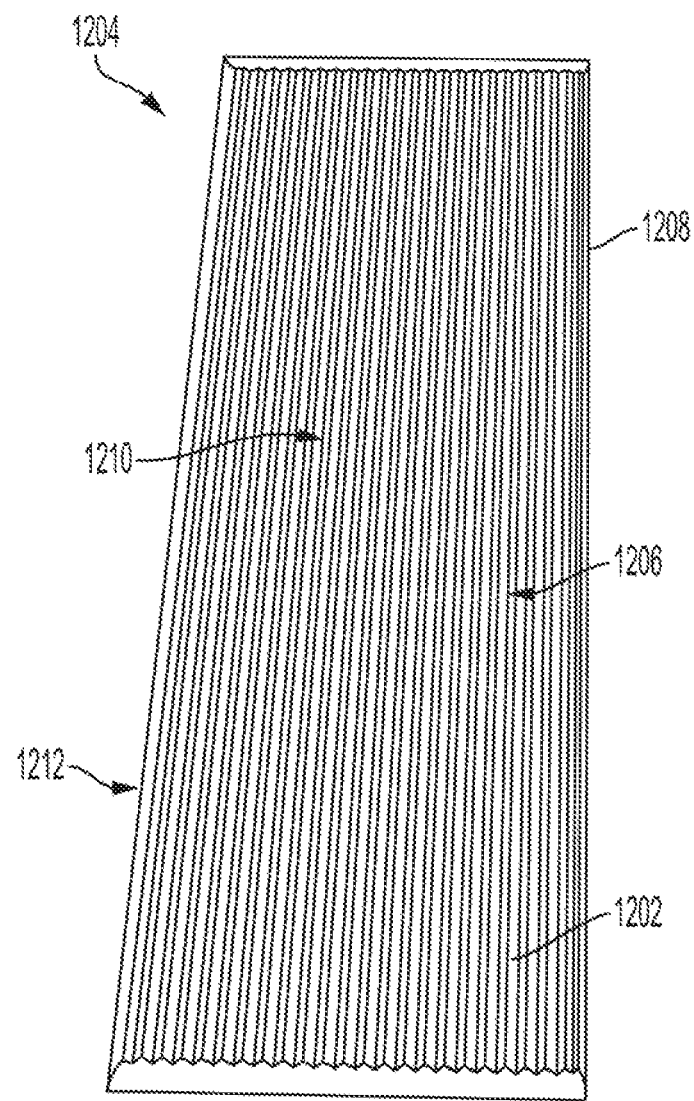
FIG. 12 illustrates a heat pipe, according to various embodiments of the invention.

In some embodiments, the O lead frame has an integrated vapor chamber or heat pipe to improve cooling. FIG. 12 illustrates an example heat pipe 1204. The heat pipe 1204 is hollow and has an evaporator 1202 located on a top surface 1210, a vapor portion 1206, and a condenser 1208 located won a bottom surface 1212. The evaporator 1202 is connected to the heat source (e.g., the power devices 202). The evaporator contains liquid that is heated by the heat source. The heated liquid is vaporized by the heat and heated vapor travels through the vapor portion 1206 to the condenser 1208.

The heated vapor cools as it contacts the condenser 1208. The cooled vapor condenses on the interior walls of the condenser 1208 and turns to liquid. The liquid travels back to the evaporator 1202, where the process will be repeated. The heating, vaporization, cooling, and condensing of the liquid in the heat pipe 1204 is an efficient way to provide cooling to the heat source.

Figure 13:
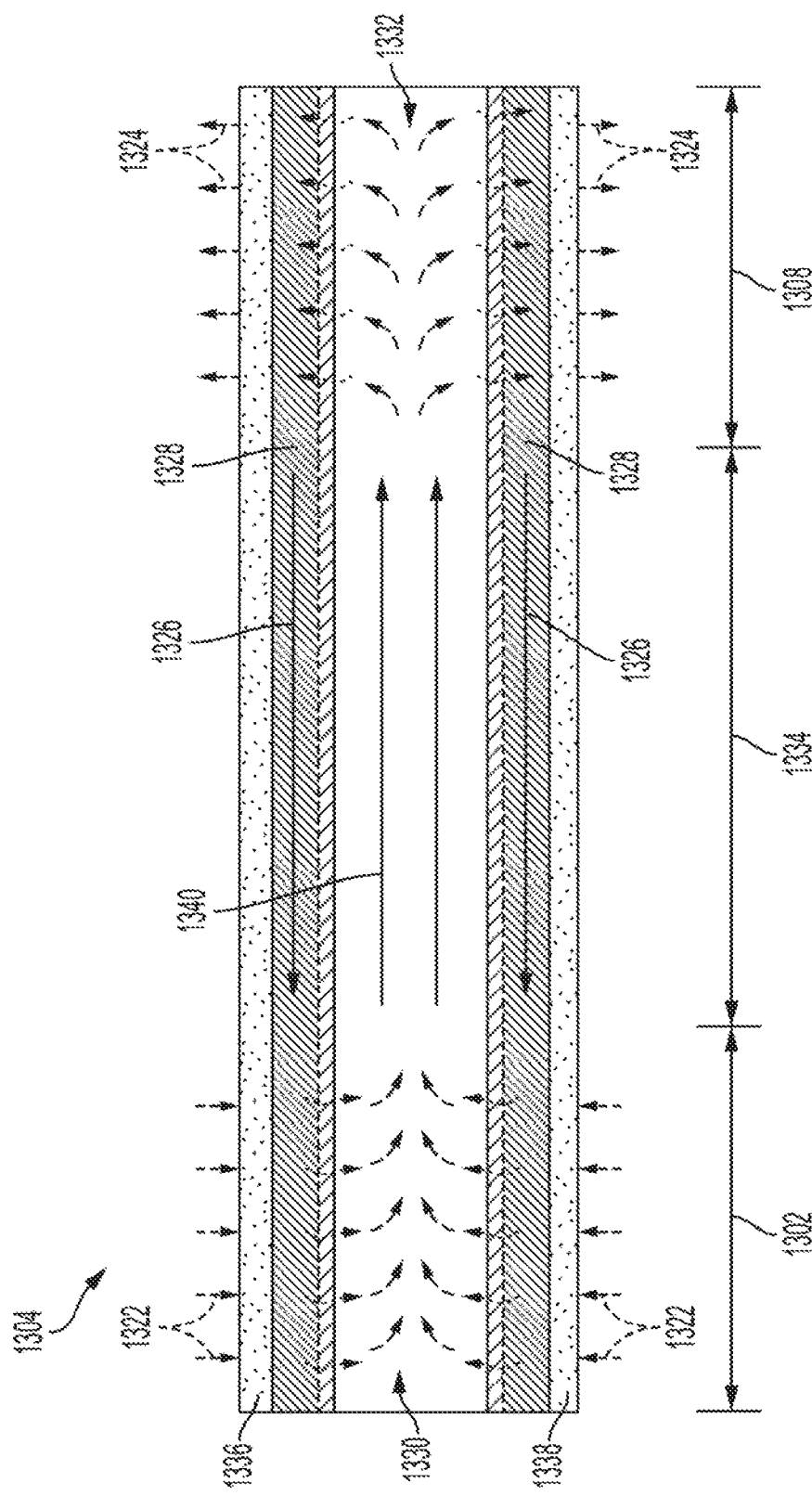
FIG. 13 illustrates a cross-sectional view of a vapor chamber, according to various embodiments of the invention.

FIG. 13 illustrates a cross-sectional view of a vapor chamber 1304 using similar principles as the heat pipe 1204. The evaporator 1302 of the vapor chamber 1304 receives heat 1322 from a heat source (e.g., power devices 202) via a first plate 1336 and a second plate 1338. The heat 1322 heats and vaporizes liquid in the vapor chamber 1304, resulting in vapor generation 1330. The vapor flows to the center of the vapor chamber 1304 and travels 1340 along the adiabatic section 1334. The vapor condenses 1332 as the heat is released 1324 along the first plate 1336 and the second plate 1338 in the condenser 1308. The condensation 1332 is absorbed by a wick 1328 lining the interior walls of the vapor chamber 1304. The condensed vapor turns to liquid and returns 1326 to an area near the evaporator 1302, and the process continues.

Figure 14A:
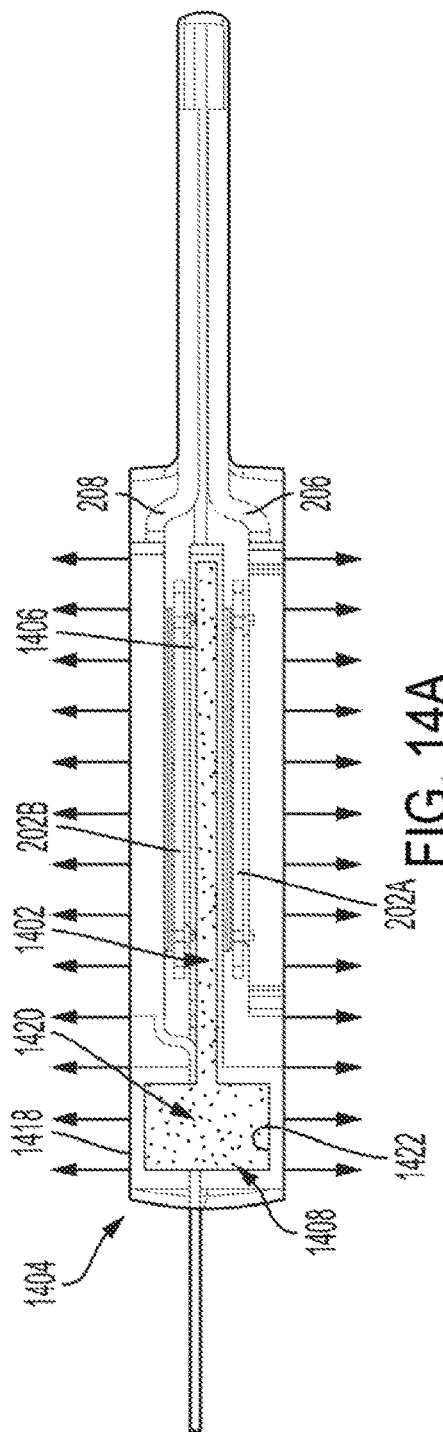
FIG. 14A-14B illustrate views of a vapor chamber O lead frame, according to various embodiments of the invention.
Figure 14B:
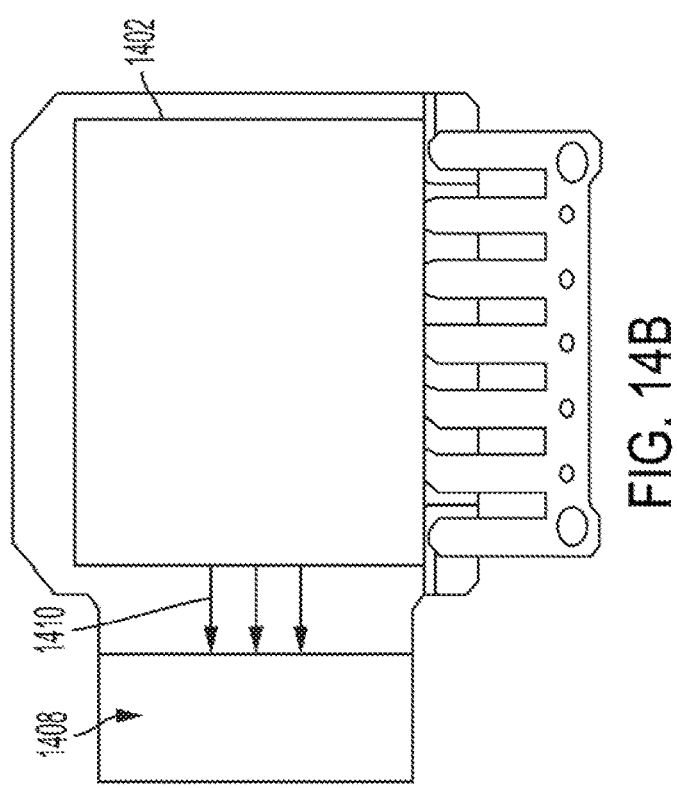

FIGS. 14A and 14B illustrate an O lead frame 1404 with an integrated vapor chamber similar to heat pipe 1204 and vapor chamber 1304. FIG. 14A is a side view of the power card with the O lead frame 1404 and FIG. 14B is a top view of the power card with the O lead frame 1404.

As shown in FIG. 14A, the O lead frame 1404 includes a body portion 1406 and a cooling portion 1408 extending from the body portion 1406. The O lead frame 1404 has an interior cavity. The body portion 1406 includes an evaporator 1402 and the cooling portion 1408 includes a condenser 1418. Lining the interior cavity of the O lead frame 1404 is a wick 1422. The evaporator 1402 and the condenser 1418 are in fluid communication.

The power devices 202A and 202B, which are coupled to the body portion 1406 of the O lead frame 1404, heat liquid within the evaporator 1402 and the liquid vaporizes. The vapor 1420 moves to the condenser 1418 of the cooling portion 1408. The vapor 1420 cools as heat from the vapor is dissipated by the walls of the condenser 1418 and the vapor condenses into a liquid along one or more interior surfaces of the condenser 1418. The condensed vapor (now a liquid) is absorbed by the wick 1422 and returned to the evaporator 1402. The process repeats and allows the O lead frame 1404 to provide cooling to the power devices 202A and 202B.

FIG. 14B illustrates the vapor flow 1410 of the vapor 1420 moving from the evaporator 1402 to the condenser chamber 1418 of the cooling portion 1408.

Figure 15:
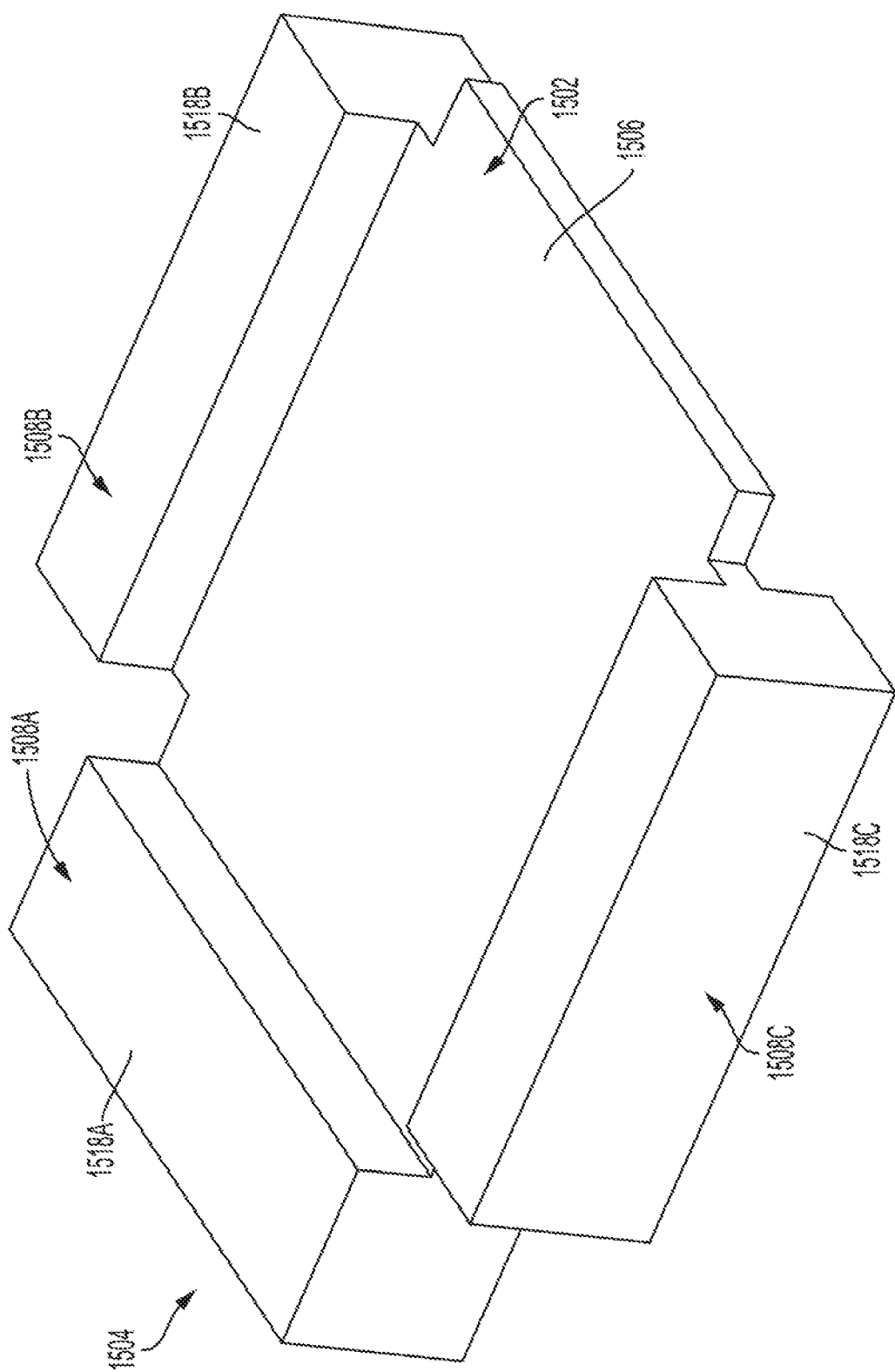
FIG. 15 illustrates an O lead frame with three cooling surfaces, according to various embodiments of the invention.

FIG. 15 illustrates an O lead frame 1504 having a body portion 1506 and multiple cooling portions 1508 extending from the body portion 1506. In particular, a first cooling portion 1508A extends along the length of the power card that the O lead frame 1504 is used in. A second cooling portion 1508B extends in a first side direction along the width of the power card. A third cooling portion 1508C extends in a second side direction along the width of the power card. Thus, the second cooling portion 1508B and the third cooling portion 1508C may be on opposite sides of the O lead frame 1504, and may each extend in directions perpendicular to the direction the first cooling portion 1508A extends in.

The body portion 1506 includes an evaporator 1502 similar to evaporator 1402. The cooling portions 1508 each include respective condensers 1518 for cooling the vapor created by the heat from the power devices that are coupled to the body portion 1506. In particular, the first cooling portion 1508A has a first condenser 1518A, the second cooling portion 1508B has a second condenser 1518B, and the third cooling portion 1508C has a third condenser 1518C. Each condenser 1518 is fluidly coupled to the evaporator 1502 to receive vapor from the evaporator and to send condensed liquid via an internal wick (e.g., wick 1422).

The additional cooling portions of the O lead frame 1504, as compared to the O lead frame 1404, may allow the O lead frame 1504 to more efficiently dissipate heat generated by the power devices. The O lead frame 1504 may be used with power cards that do not have a set of signal terminals on the side of the power card, such as power card 200 illustrated in FIG. 2F. While three discrete cooling portions are illustrated in FIG. 15, in some embodiments, there may be more cooling portions (e.g., 6 cooling portions, 9 cooling portions, etc.) or there may be one continuous cooling portion spanning a perimeter of the O lead frame 1504 on three sides of the body portion 1506.

In some embodiments, the cooling portions 808, 1108, 1408, 1508 may be referred to as terminal portions. In some embodiments, any of the O lead frames described herein may be made of a material having high thermal conductivity in two axes, but low thermal conductivity along a third axis, for improving the cooling capabilities of the O lead frame. Except as noted herein, any of the components of any embodiment described herein may be used with any other embodiment. The embodiments described and illustrated are non-limiting.

Figure 16:
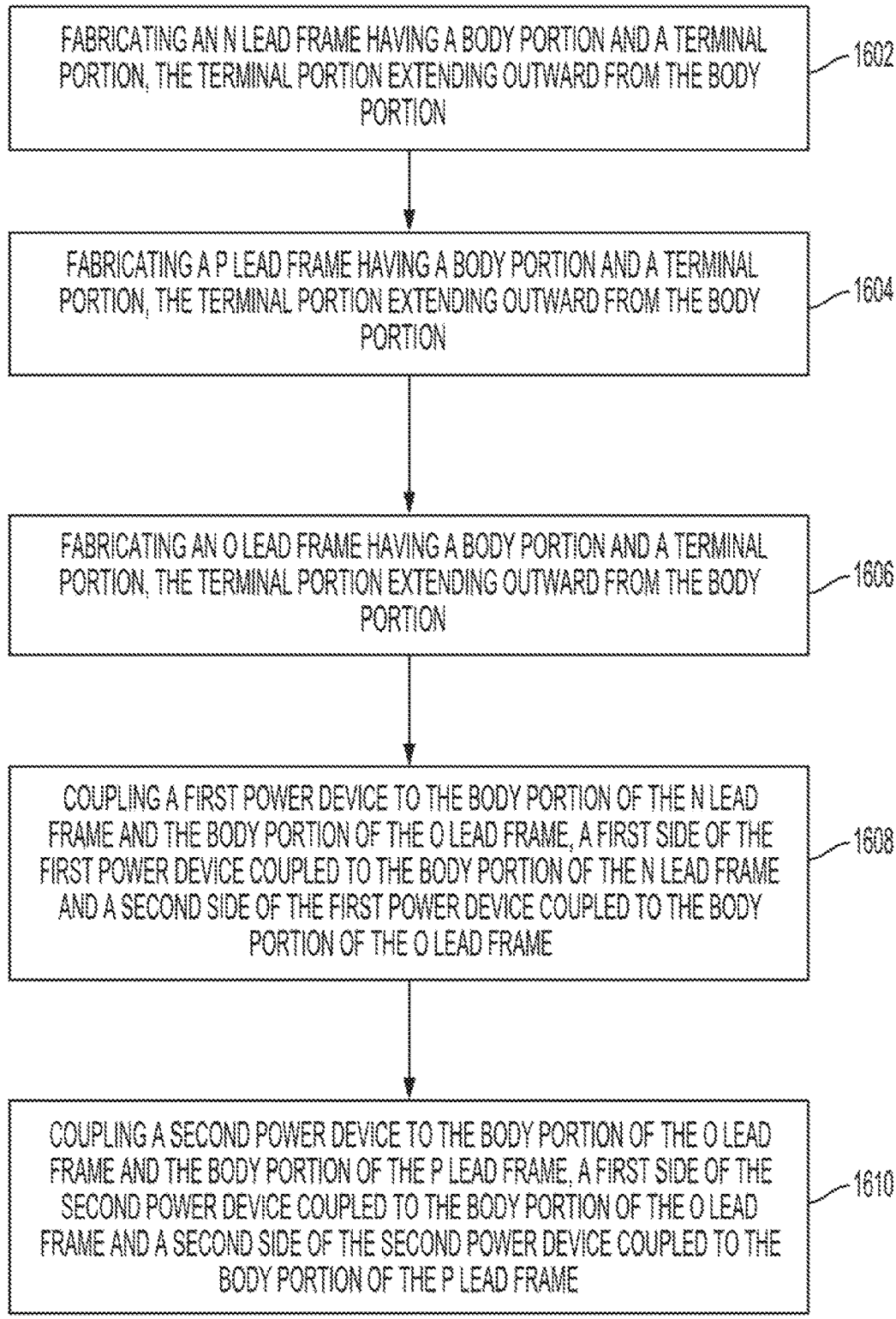
FIG. 16 illustrates a flowchart of a process of fabricating the system, according to various embodiments of the invention.

FIG. 16 illustrates a process 1600 for fabricating a power card (e.g., power card 200, 500, 800) described herein. An N lead frame (e.g., N lead frame 206) is fabricated (step 1602). The N lead frame has a body portion (e.g., body portion 232) and a terminal portion (e.g., terminal portion 226) extending outward from the body portion. The N lead frame may be fabricated by stamping, etching, casting, or any other method for fabricating lead frames. The N lead frame may be made of a conductive material, such as copper or an alloy of copper.

A P lead frame (e.g., P lead frame 208) is fabricated (step 1604). The P lead frame has a body portion (e.g., body portion 230) and a terminal portion (e.g., terminal portion 224) extending outward from the body portion. The P lead frame may be fabricated by stamping, etching, casting, or any other method for fabricating lead frames. The P lead frame may be made of a conductive material, such as copper or an alloy of copper.

An O lead frame (e.g., O lead frame 204, 504, 604, 704, 804, 1104, 1404, 1504) is fabricated (step 1606). The O lead frame has a body portion (e.g., body portion 228) and a terminal portion (e.g., terminal portion 222) extending outward from the body portion. In some embodiments, the O lead frame has one or more cooling portions (e.g., cooling portion 808, 1108, 1408, 1508) extending outward from the body portion instead of a terminal portion. The O lead frame may be fabricated by stamping, etching, casting, soldering, molding, or any other method for fabricating lead frames. The O lead frame may be made of a conductive material, such as copper or an alloy of copper.

A first power device (e.g., power device 202) is coupled to the body portion of the N lead frame and the body portion of the O lead frame (step 1608). The first power device may have a first side (e.g., first side 480) coupled to the body portion of the N lead frame. The first power device may have a second side (e.g., second side 482) coupled to the body portion of the O lead frame.

A second power device (e.g., power device 202) is coupled to the body portion of the O lead frame and the body portion of the P lead frame (step 1610). The second power device may have a first side (e.g., first side 480) coupled to the body portion of the O lead frame. The second power device may have a second side (e.g., second side 482) coupled to the body portion of the P lead frame.

Solder may be located between the components of the power card, and reflow soldering may be used to connect the respective components of the power card together, as described herein.

The N lead frame, the O lead frame, and the P lead frame may be oriented such that the terminal portion of the O lead frame is at a first end of the power card and the terminal portion of the P lead frame and the terminal portion of the N lead frame are at a second end of the power card.

An insulator may be disposed between the terminal portion of the P lead frame and the terminal portion of the N lead frame. A first signal terminal may be connected to the first power device using solder balls, and a second signal terminal may be connected to the second power device using solder balls.

The resin (e.g., resin 210) may encase a portion of the power card. The resin may be injection molded to the power card such that all gaps between the components of the power card are occupied with resin. The terminal portion of the O lead frame, portions of the sets of signal terminals, a portion of the terminal portion of the P lead frame, and a portion of the terminal portion of the N lead frame may not be covered in resin, with the remaining components of the power card being encased in resin. The exposed portion of the terminal portion of the P lead frame may be the top surface of the terminal portion. The exposed portion of the terminal portion of the N lead frame may be the bottom surface of the terminal portion.

The cooling portions (e.g., cooling portion 808, 1108, 1408, 1508) may also be terminal portions of their respective O lead frames, configured to provide an output signal, as described herein.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A power card for use in a vehicle, the power card comprising:
   an N lead frame having a body portion and a terminal portion, the terminal portion extending outward from the body portion;
   a P lead frame having a body portion and a terminal portion, the terminal portion extending outward from the body portion;
   an O lead frame having a body portion and a terminal portion, the terminal portion extending outward from the body portion, the O lead frame being located between the N lead frame and the P lead frame;
   a first power device being located on a first side of the O lead frame between the body portion of the N lead frame and the body portion of the O lead frame; and
   a second power device being located on a second side of the O lead frame between the body portion of the O lead frame and the body portion of the P lead frame, the body portion of the O lead frame having one or more channels configured to receive a cooling liquid for cooling the first power device and the second power device.

2. The power card of claim 1, further comprising a manifold surrounding the body portion of the N lead frame, the body portion of the P lead frame, and the body portion of the O lead frame, the manifold being fluidly coupled to the one or more channels of the body portion of the O lead frame.

3. The power card of claim 2, wherein the manifold surrounds a lengthwise periphery of the body portion of the N lead frame, the body portion of the P lead frame, and the body portion of the O lead frame.

4. The power card of claim 2, wherein the manifold further comprises a plurality of channels configured to receive the cooling liquid.

5. The power card of claim 4, wherein the manifold further comprises an inlet port fluidly coupled to the one or more channels of the manifold and the one or more channels of the body portion of the O lead frame, the inlet port configured to receive the cooling liquid and provide the cooling liquid to the one or more channels of the manifold and the one or more channels of the body portion of the O lead frame, and
   wherein the manifold further comprises an outlet port fluidly coupled to the one or more channels of the manifold and the one or more channels of the body portion of the O lead frame, the outlet port configured to receive the cooling liquid from the one or more channels of the manifold and the one or more channels of the body portion of the O lead frame and expel the cooling liquid.

6. The power card of claim 5, further comprising a first lengthwise edge and a second lengthwise edge opposite the first lengthwise edge, the inlet port located on the first lengthwise edge and the outlet port located on the second lengthwise edge.

7. The power card of claim 4, wherein the plurality of channels of the manifold include a top channel located radially outward of the body portion of the P lead frame, and a bottom channel located radially outward of the body portion of the N lead frame.

8. The power card of claim 7, further comprising a first heat sink coupled to the body portion of the P lead frame and a second heat sink coupled to the body portion of the N lead frame,
   wherein the top channel comprises a plurality of channels defined by fins of the first heat sink and the bottom channel comprises a plurality of channels defined by fins of the second heat sink.

9. The power card of claim 1, wherein the O lead frame comprises a top portion having the one or more channels formed integrally therein, and a bottom portion coupled to the top portion.

10. A power system comprising:
    a power card having:
       an O lead frame located between an N lead frame and a P lead frame,
       a first power device located on a first side of the O lead frame between the N lead frame and the O lead frame, and
       a second power device located on a second side of the O lead frame between the O lead frame and the P lead frame, the O lead frame having one or more channels configured to receive a cooling liquid for cooling the first power device and the second power device; and
    a liquid cooler coupled to the one or more channels of the O lead frame and configured to provide the cooling liquid to the one or more channels of the O lead frame.

11. The power system of claim 10, further comprising a manifold surrounding the N lead frame, the P lead frame, and the O lead frame, the manifold being fluidly coupled to the one or more channels of the body portion of the O lead frame and the liquid cooler.

12. The power system of claim 11, wherein the manifold surrounds a lengthwise periphery of a body portion of the N lead frame, a body portion of the P lead frame, and a body portion of the O lead frame.

13. The power system of claim 11, wherein the manifold further comprises a plurality of channels configured to receive the cooling liquid.

14. The power system of claim 13, wherein the manifold further comprises an inlet port fluidly coupled to the one or more channels of the manifold and the one or more channels of the O lead frame, the inlet port configured to receive the cooling liquid from the liquid cooler and provide the cooling liquid to the one or more channels of the manifold and the one or more channels of the O lead frame, and
   wherein the manifold further comprises an outlet port fluidly coupled to the one or more channels of the manifold and the one or more channels of the O lead frame, the outlet port configured to receive the cooling liquid from the one or more channels of the manifold and the one or more channels of the O lead frame and expel the cooling liquid to the liquid cooler.

15. The power system of claim 13, wherein the plurality of channels of the manifold include a top channel located radially outward of the P lead frame, and a bottom channel located radially outward of the N lead frame.

16. The power system of claim 15, further comprising a first heat sink coupled to the body portion of the P lead frame and a second heat sink coupled to the body portion of the N lead frame,
   wherein the top channel comprises a plurality of channels defined by fins of the first heat sink and the bottom channel comprises a plurality of channels defined by fins of the second heat sink.

17. The power system of claim 10, wherein the O lead frame comprises a top portion having the one or more channels formed integrally therein, and a bottom portion coupled to the top portion.

18. The power system of claim 10, wherein the liquid cooler is coupled to a vehicle device and configured to provide the cooling liquid to the vehicle device.

19. A lead frame for use in a vehicle power card, the lead frame comprising:
   a body portion having a first side coupled to a first power device, a second side coupled to a second power device, and one or more channels configured to receive a cooling liquid for cooling the first power device and the second power device; and
   a terminal portion extending outward from the body portion.

20. The lead frame of claim 19, further comprising a top portion having the one or more channels formed integrally therein, and a bottom portion coupled to the top portion.

\* \* \* \* \*